(12) United States Patent
Nagatani et al.

(10) Patent No.: US 7,848,449 B2
(45) Date of Patent: Dec. 7, 2010

(54) OFFSET COMPENSATION DEVICE

(75) Inventors: Kazuo Nagatani, Kawasaki (JP);
Hiroyoshi Ishikawa, Kawasaki (JP);
Nobukazu Fudaba, Kawasaki (JP);
Tokuro Kubo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1168 days.

(21) Appl. No.: 10/568,334

(22) PCT Filed: Mar. 31, 2004

(86) PCT No.: PCT/JP2004/004647

§ 371 (c)(1),
(2), (4) Date: Jul. 26, 2006

(87) PCT Pub. No.: WO2005/025168

PCT Pub. Date: Mar. 17, 2005

(65) Prior Publication Data
US 2007/0110183 A1 May 17, 2007

(30) Foreign Application Priority Data
Sep. 5, 2003 (WO) ........................ PCT/JP03/11364

(51) Int. Cl.
*H04L 25/49* (2006.01)
(52) U.S. Cl. ........................... 375/296; 375/285
(58) Field of Classification Search ................. 375/296, 375/297, 295
See application file for complete search history.

(56) References Cited

U.S. PATENT DOCUMENTS

| 5,903,823 A | 5/1999 | Moriyama et al. |
| 6,081,698 A | 6/2000 | Moriyama et al. |
| 6,091,941 A | 7/2000 | Moriyama et al. |
| 2002/0018531 A1* | 2/2002 | Ratto ........................ 375/297 |
| 2003/0095607 A1* | 5/2003 | Huang et al. ................ 375/296 |
| 2003/0108120 A1* | 6/2003 | Hori et al. ................... 375/297 |

FOREIGN PATENT DOCUMENTS

JP 09-83587 3/1997

(Continued)

OTHER PUBLICATIONS

International Search Report dated Jun. 15, 2004.
International Preliminary Examination Report on Patentability for the related International Application No. PCT/JP2004/004647, dated Jun. 20, 2006, English language translation attached.

*Primary Examiner*—Shuwang Liu
*Assistant Examiner*—David Huang
(74) *Attorney, Agent, or Firm*—Katten Muchin Rosenman LLP

(57) ABSTRACT

In an electronic device having a circuit outputting a vector sum of two quadrature vector signals, an offset compensating device compensates the offset contained in the vector sum. The offset compensating device aims to flexibly adapt to deviation in characteristics and performances and various fluctuations, and to compensate offset stably and accurately. The offset compensating device includes a deviation monitor unit creating a vector signal by A/D-converting the aforementioned vector sum and by quadrature-demodulating it and monitoring the deviation of the DC components superposed on the vector signal, and an adaptive control unit updating the compensation vector determined in advance, based on adaptive algorithm minimizing expectation value of the product of the inner product between an increment vector and the compensation vector, and the latest deviation vector, and adding the compensation vector to an offset vector to be inputted, while being superposed on the input signal, to a circuit.

14 Claims, 22 Drawing Sheets

FOREIGN PATENT DOCUMENTS

| | | |
|---|---|---|
| JP | 10-079693 | 3/1998 |
| JP | 2000-209295 | 7/2000 |
| JP | 2000-270037 | 9/2000 |
| JP | 2000-278345 | 10/2000 |
| JP | 2001-339452 | 12/2001 |
| JP | 2002-077285 | 3/2002 |
| JP | 2002-319989 | 10/2002 |
| JP | 2003-142959 | 5/2003 |

* cited by examiner

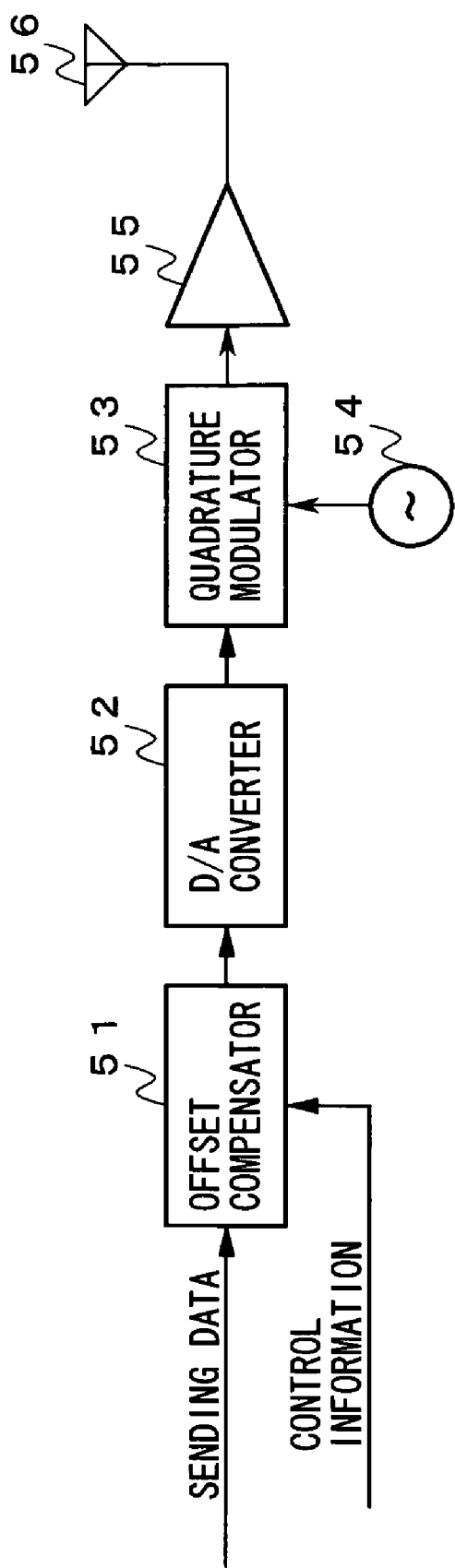

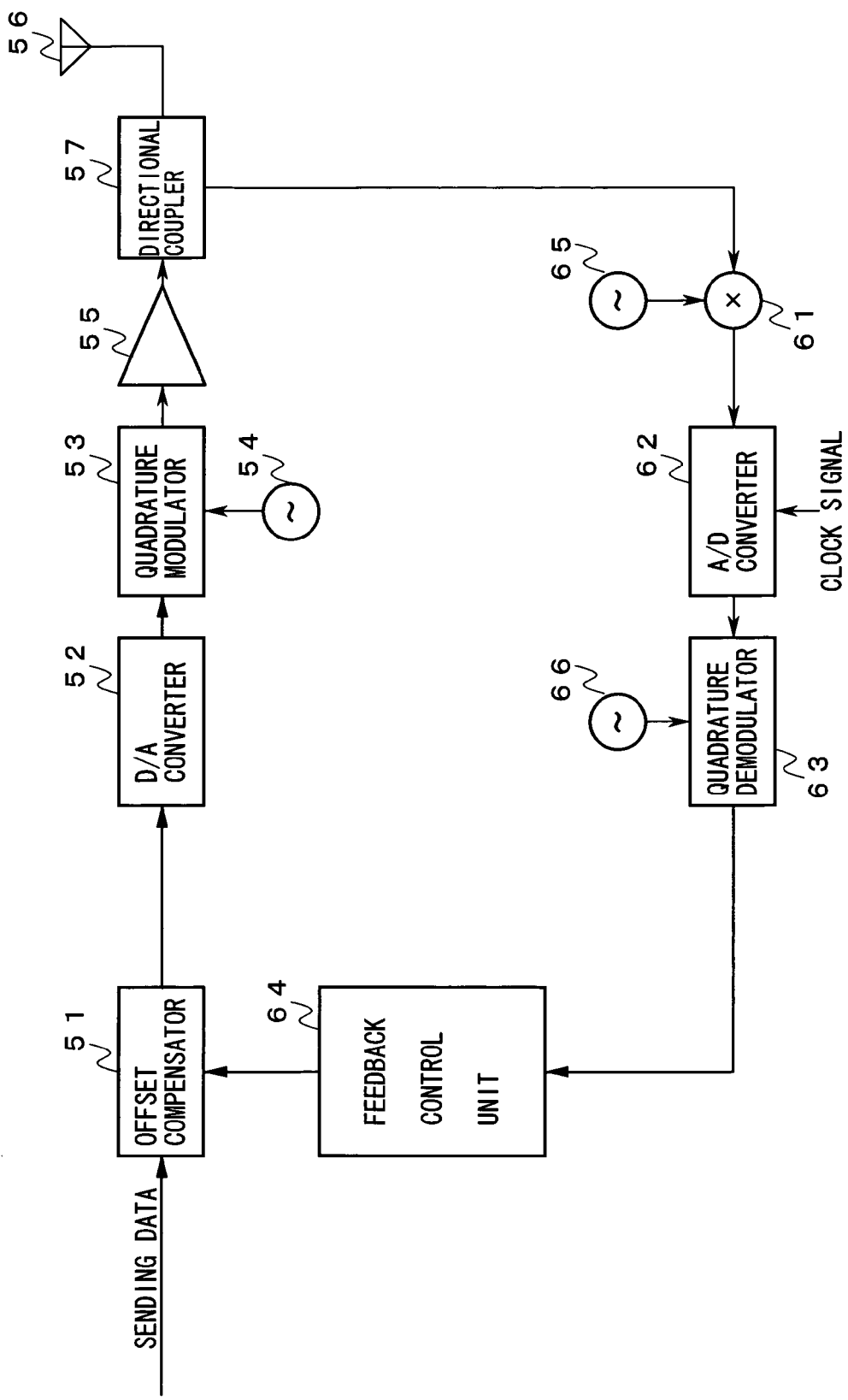

OFFSET COMPENSATION DEVICE

CROSS REFERENCE TO RELATED APPLICATION

This application is a National Stage of International Application PCT/JP2004/004647, filed Mar. 31, 2004, and designating the U.S., which is based upon and claims the benefit of priority from International Patent Application PCT/JP2003/11364, filed Sep. 5, 2003, the entire contents of which are herein incorporated by reference.

BACKGROUND OF THE INVENTION

1. Field of the Invention

The present invention relates to an electronic device which is provided with a circuit for processing two quadrature AC signals by predetermined operations in response to an input signal thereby to output a vector sum of the operations and, more particularly, to an offset compensation device for compensating the offset which is caused in the vector sum due to the change in the characteristics and the deviation of analog circuits for the individual operations.

2. Description of the Related Art

The quadrature modulator for generating a modulated signal as the sum of products (or the vector sum) between two quadrature carrier signals and an input signal can realize various modulation schemes and constellations so that it is adapted for various communication devices or electronic devices.

In this modulated signal, moreover, there are superposed the components (as will be called the "offset"), which are caused to leak the carrier components or to deteriorate other performances by the differences of characteristics and the fluctuations of the circuit for multiply the two carrier signals individually in an analog area.

FIG. 21 is a block diagram showing an example of the configuration of a radio transmission device equipped with a quadrature modulator for compensating the offset.

To the two inputs of an offset compensator 51, as shown, there are inputted sending data, which are to be transmitted in parallel through an I-channel and a Q-channel individually corresponding to the aforementioned two carrier signals. Control information is inputted from the outside to the control input of the offset compensator 51. The output of this offset compensator 51 is connected with the input of a D/A converter 52 (for parallel D/A conversions individually corresponding to the aforementioned I-channel and Q-channel), the output of which is connected with the corresponding input of a quadrature modulator 53. The quadrature modulator 53 has its carrier input connected with the output of an oscillator 54 and its output connected with the feeding point of an antenna 56 through a power amplifier 55.

In the radio communication device (as will be called the "first prior art example"), the offset compensator 51 adds the aforementioned control information to either of signals (as will be called the "modulated signals" for simplicity) individually indicating the aforementioned two sending data. The D/A converter 52 converts the two modulated signals containing the modulated signal, to which the control information is added, into individual analog signals. The quadrature modulator 53 converts the carrier signals generated by the oscillator 54, into two quadrature carrier signals thereby to generate a modulated signal as the sum of products between those two carrier signals and the aforementioned analog signal. The power amplifier 55 sends the modulated signal at a desired level through the antenna 56.

Due to the difference in the characteristics of the D/A converter 52 individually corresponding to the I-channel and Q-channel, for example, of the components of the carrier signal to be fed by the oscillator 54 to the quadrature modulator 53, moreover, the aforementioned control voltage is manually set to the value, for which the component of the carrier signal observed at the output terminal of the quadrature modulator 53 (or the power amplifier 55).

Here, the offset due to the difference in the characteristics of the D/A converter 52 can be compensated, for example, by directly increasing/decreasing the DC reference voltage to be given to the D/A converter 52 (as will be called the "second prior art example") or by directly increasing/decreasing the DC voltage to be superposed on one or both the aforementioned analog signals to be inputted to the quadrature modulator 53 (as will be called the "third prior art example").

FIG. 22 is a block diagram showing another example of the configuration of the radio transmission device equipped with the quadrature modulator for compensating the offset.

The configuration of the radio transmission device shown in FIG. 22 (as will be called the "fourth prior art example") is different in the following points from that of the radio transmission device shown in FIG. 21:

the output of the power amplifier 55 is connected through a directional coupler 57 to the feeding point of the antenna 56;

the monitor terminal of the directional coupler 57 is connected with the control input of the offset compensator 51 through a mixer 61, an A/D converter 62, a quadrature demodulator 63 and a feedback control unit 64, which are cascaded; and the output of an oscillator 65 is connected with the local-frequency input of the mixer 61, and the output of an oscillator 66 is connected with the carrier input of the quadrature demodulator 63.

In response to the local-frequency signal generated by the oscillator 65, the mixer 61 frequency-converts the modulated signal given through the directional coupler 57, thereby to generate the monitored intermediate-frequency signal indicating the component of the modulated signal with an intermediate-frequency band.

The A/D converter 62 the monitored intermediate-frequency signal into a digital signal synchronized with a clock signal of a predetermined frequency.

In response to the "two quadrature carrier signals generated by the oscillator 66", the quadrature demodulator 63 quadrature-demodulates the digital signal thereby to generate the quadrature-monitored signals i and q individually corresponding to the quadrature I-channel and Q-channel.

The feedback control unit 64 smoothes the quadrature-monitored signals i and q on a complex plane thereby to determine the offset components individually contained in those quadrature-monitored signals i and q, and feeds back those offset components to the offset compensator 51 thereby to compensate the offset, which is caused by the imbalance between the aforementioned I-channel and Q-channel, on the "section from the output terminal of the offset compensator 51 through the D/A converter 52 to the input terminal of the quadrature modulator 53".

In this fourth prior art example, therefore, the quadrature demodulation is performed after the A/D conversion was made in the feedback passage. Unlike the later-described Patent Publication 4, for example, the feedback passage is not provided with the A/D converters individually corresponding to the aforementioned I-channel and Q-channel, and the compensation of the offset between those A/D converters is not required, so that the power consumption is reduced together with the cost and the size.

Here in the aforementioned first to third prior art examples, for example, the compensation of the offset is not stably performed, in case the difference in the characteristics of the D/A converter 52 corresponding to the I-channel and the Q-channel widely varies according to the environmental conditions and the aging. As a result, the components of the useless carrier signal may be contained in the modulated wave to be sent.

In these prior art examples, on the other hand, a spectrum analyzer or another dedicated device has to be applied for monitoring the components of the carrier signal, which are observed at the output terminal of the quadrature modulator 53 (or the power amplifier 55).

In the aforementioned fourth prior art example, on the other hand, the components, which are applied to the aforementioned A/D conversion by the A/D converter 62, of the clock signal can be transmitted to the output of that A/D converter 62 due to either the useless coupling in the A/D converter 62 between the different wirings or the characteristics of the elements. Moreover, the components of the clock signal thus transmitted are superposed on the "offset components determined by the feedback control unit 64 and adapted to be fed back to the offset compensator 51" especially in case they have a frequency equal to that of the "components of the carrier of the aforementioned monitored intermediate-frequency signal".

In the fourth prior art example, therefore, the accuracy of compensations of the offset is not always high irrespective of the single number of the A/D converters to be mounted, and may highly vary according to the temperature or the aging.

[Patent Publication 1]
Japanese Unexamined Patent Application Publication No. 9-83587 (Abstract, FIG. 7)

[Patent Publication 2]
Japanese Unexamined Patent Application Publication No. 2000-270037 (Abstract, FIG. 1)

[Patent Publication 3]
Japanese Unexamined Patent Application Publication No. 2000-278345 (Abstract, FIG. 1)

[Patent Publication 4]
Japanese Unexamined Patent Application Publication No. 10-79693 (Abstract)

SUMMARY OF THE INVENTION

An object of the present invention is to provide an offset compensation device which can flexibly adapt for the deviation of characteristics and performances to accompany circuits or elements and for the various fluctuations of those characteristics or performances and which can compensate the offset stably and accurately.

On the other hand, an object of the invention resides in that the offset contained in the vector sum to be outputted by a circuit for outputting the vector sum is accurately and stably suppressed, even in case the characteristics of the circuit are accompanied by deviation or can widely vary according to the environmental conditions, aging and so on.

Moreover, an object of the invention resides in that the delay in the useless convergence, which is caused by the excessively small absolute value of the aforementioned inner product, is avoided even in case the convergence of the offset vector proceeds on the basis of an adaptive algorithm, and in that the offset is stably and accurately compensated.

On the other hand, an object of the invention resides in that the invention can be applied to various device and system configurations.

Moreover, an object of the invention resides in that the procedures of the adaptive control are simplified to reduce the throughput and the power and to improve the responsiveness.

On the other hand, an object of the invention resides in that a quick shift can be made to the steady state at the time of starting or reopening the run.

Moreover, an object of the invention resides in that the power consumption is made smaller than that of the case, in which the adaptive control is steadily made, and that the restrictions on the thermal design, assembly and cost/size reduction are loosened.

On the other hand, an object of the invention resides in that the power consumption is highly reliably and stably reduced.

Moreover, an object of the invention resides in that the power consumption due to the useless action of an adaptive control unit is highly probably avoided after the offset vector highly accurately converged into the proper vector, so long as the factor for updating the offset vector drastically does not occur.

On the other hand, an object of the invention resides in that the offset relating to various circuits can be compensated.

Moreover, an object of the invention resides in that the various input signals and the aforementioned configurations of the circuit can be flexibly adapted for.

On the other hand, an object of the invention resides in that the modes of various processings to be performed by the aforementioned circuits can be flexibly adapted for.

Moreover, an object of the invention resides in that the imbalance of the quadrature modulator is accurately suppressed.

On the other hand, an object of the invention resides in that the imbalance of the quadrature modulator can be stably and accurately suppressed, and that the strain compensation can be accurately achieved over a wide band.

Moreover, an object of the invention resides in that the wide variation of the temperature and other environments and the aging can be flexibly adapted for, and that the imbalance of the quadrature modulator can be accurately and stably suppressed.

On the other hand, an object of the invention resides in that the imbalance of the quadrature modulator can be stably and accurately suppressed even in case the occupied band of the modulated wave can widely vary.

Moreover, an object of the invention resides in that the performances and the reliability are improved and stably kept in addition to the flexible adaptation for the various configurations and characteristics of the hardware.

Summary of the invention is described as follows.

In the first offset compensation device according to the invention, a deviation monitor unit creates a vector signal by A/D-converting the vector sum of the results of processings applied to two quadrature AC signals individually in response to an input signal and by quadrature-demodulating, and monitors the deviation of the DC components superposed on the vector signal. An adaptive control unit updates the compensation vector determined in advance, on the basis of an adaptive algorithm to minimize the expectation value of the product of the inner product between an increment vector indicating the increment of the deviation in the order of time series and the compensation vector, and the latest deviation vector indicating the deviation, and adds the compensation vector to an offset vector to be inputted, while being superposed on the input signal, to a circuit to output the vector sum.

This compensation vector implies the direction and the absolute value, in and to which the offset vector superposed in the aforementioned input signal and inputted to the aforementioned circuit is to be updated. On the other hand, the increment vector implies the fluctuation, which is caused in the aforementioned deviation as a result of the application of the offset vector in place of such offset vector.

Specifically, the inner product of those compensation vector and increment vector corresponds to the cosine value of the total of the phase-shifts of the section from the output of the aforementioned circuit to the input terminal of the "initial stage of the deviation monitor unit or the stage for the aforementioned A/D conversion", and is suitably updated to the value adapted for the difference and fluctuation of the phase-shifts.

Moreover, the offset vector is updated under the adaptive algorithm to minimize the expectation value of the product of the inner product and the latest deviation, so that it is kept at the value flexibly and stably adapted for the deviation or fluctuation of the aforementioned phase-shifts.

Therefore, the offset contained in the vector sum outputted by the aforementioned circuit can be accurately and stably suppressed, even in case the characteristics of the aforementioned circuit and/or the section are accompanied by the deviations or in case the characteristics can be widely varied according to the environmental conditions, the aging or the like.

In the second offset compensation device according to the invention, the deviation monitor unit creates a vector signal by A/D-converting the vector sum of the results of processings applied to two quadrature AC signals individually in response to an input signal and by quadrature-demodulating, and monitors the deviation of the DC components superposed on the vector signal. The adaptive control unit determines a compensation vector on the basis of an adaptive algorithm to minimize the expectation value of the product of the inner product between the input signal and the vector signal and an increment vector indicating the increment of the deviation in the order of time series, and adds the compensation vector to an offset vector to be inputted, while being superposed on the input signal, to a circuit to output the vector sum.

Specifically, the procedure of the adaptive control, in which the compensation vector is determined on the basis of the aforementioned adaptive algorithm, is different from the aforementioned first offset compensation device in that the inner product of the aforementioned input signal and the vector signal is applied in place of the inner product of the compensation vector and the increment vector.

However, this inner product corresponds to the cosine value of the phase difference between the input signal inputted to the aforementioned circuit and the vector signal generated by quadrature-demodulating the vector sum outputted by the circuit, in the digital area. So long as the phase-shift of that circuit is so small as can be permitted, therefore, that inner product is equivalent to the cosine value of the total of the phase-shifts of the aforementioned section, and is properly updated to the value adapted for the difference and fluctuation of the phase-shifts.

Even in case, therefore, the deviation is followed by the characteristics of the aforementioned circuit and/or section, or in case those characteristics can widely vary according to the environmental conditions, the aging or the like, the offset contained in the vector sum to be outputted by that circuit can be accurately and stably suppressed like the aforementioned offset compensation device.

In the third offset compensation device according to the invention, the deviation monitor unit creates a vector signal by A/D-converting the vector sum of the results of processings applied to two quadrature AC signals individually in response to an input signal and by quadrature-demodulating, and monitors the deviation of the DC components superposed on the vector signal. The adaptive control unit updates the compensation vector determined in advance, on the basis of an adaptive algorithm to minimize the expectation value of the product of the sum of the inner product in a vector space between an increment vector indicating the increment of the deviation in the order of time series and the compensation vector, and the latest deviation vector indicating the deviation, and adds the compensation vector to an offset vector to be inputted, while being superposed on the input signal, to a circuit to output the vector sum.

The absolute value of the sum of the aforementioned inner products does not take an excessively small value, even in the procedure where the aforementioned compensation vector converges into the proper vector on the basis of the aforementioned adaptive algorithm.

Even in case, therefore, the convergence of the offset vector has advanced on the basis of the adaptive algorithm, the useless delay in convergence due to the fact that the absolute value of the aforementioned inner product takes the excessively small value is avoided, and the offset is stably and accurately compensated.

In the fourth offset compensation device according to the invention, the deviation monitor unit creates a vector signal by A/D-converting the vector sum of the results of processings applied to two quadrature AC signals individually in response to an input signal and by quadrature-demodulating, and monitors the deviation of the DC components superposed on the vector signal. The adaptive control unit determines a compensation vector on the basis of an adaptive algorithm to minimize the expectation value of the product of the inner product in a vector space between the input signal and the vector signal and an increment vector indicating the increment of the deviation in the order of time series, and adds the compensation vector to an offset vector to be inputted, while being superposed on the input signal, to a circuit to output the vector sum.

Specifically, the procedure of the adaptive control, in which the compensation vector is determined on the basis of the aforementioned adaptive algorithm, is different from the aforementioned first offset compensation device in that the inner product of the aforementioned input signal and the vector signal is applied in place of the inner product of the compensation vector and the increment vector.

However, this inner product corresponds to the cosine value of the phase difference between the input signal inputted to the aforementioned circuit and the vector signal generated by quadrature-demodulating the vector sum outputted by the circuit, in the digital area. So long as the phase-shift of that circuit is so small as can be permitted, therefore, that inner product is equivalent to the cosine value of the total of the phase-shifts of the aforementioned section, and is properly updated to the value adapted for the difference and fluctuation of the phase-shifts.

Even in case, therefore, the convergence of the offset vector has advanced on the basis of the adaptive algorithm, like the aforementioned third offset compensation device, the useless delay in convergence due to the fact that the absolute value of the aforementioned inner product takes the excessively small value is avoided, and the offset is stably and accurately compensated.

In the fifth offset compensation device according to the invention, the deviation monitor unit creates a vector signal by A/D-converting the vector sum of the results of processings applied to two quadrature AC signals individually in response to an input signal and by quadrature-demodulating, and monitors the deviation of the DC components superposed on the vector signal. The adaptive control unit; subtracts from the vector signal the inner product between an increment vector indicating the increment of the deviation in the order of time series and the compensation vector determined in advance; updates the compensation vector on the basis of an adaptive algorithm to minimize the expectation value of the latest deviation vector indicating the deviation; and adds the compensation vector to an offset vector to be inputted, while being superposed on the input signal, to a circuit to output the vector sum.

This compensation vector is updated not by the product of the aforementioned inner product and the latest deviation vector but on the basis of the adaptive algorithm to minimize only that deviation vector. This inner product is fed back to the upstream stage of the adaptive control unit for performing the adaptive control on the basis of that adaptive algorithm.

Specifically, the adaptive control unit to be performed by the adaptive control unit is substantially equivalent to the adaptive control which is made in the aforementioned first offset compensation unit, because the aforementioned negative feedback is done beforehand.

Therefore, the offset contained in the vector sum outputted by the vector sum outputting circuit can be accurately and stably suppressed like the first offset compensation device, even in case the characteristics of the aforementioned circuit and/or the section are accompanied by the deviations or in case the characteristics can be widely varied according to the environmental conditions, the aging or the like.

In the sixth offset compensation device according to the invention, the deviation monitor unit creates a vector signal by A/D-converting the vector sum of the results of processings applied to two quadrature AC signals individually in response to an input signal and by quadrature-demodulating, and monitors the deviation of the DC components superposed on the vector signal. The adaptive control unit: subtracts the inner product between the input signal and the vector signal from the vector signal; updates the compensation vector on the basis of an adaptive algorithm to minimize the expectation value of the latest deviation vector indicating the deviation; and adds the compensation vector to an offset vector to be inputted, while being superposed on the input signal, to a circuit to output the vector sum.

Specifically, this offset compensation device is different from the aforementioned fifth offset compensation device in that not the inner product of the compensation vector and the increment vector but the inner product of the aforementioned input signal and the vector signal is applied.

However, this inner product corresponds to the cosine value of the phase difference between the input signal inputted to the aforementioned circuit and the vector signal generated by quadrature-demodulating the vector sum outputted by the circuit, in the digital area. So long as the phase-shift of that circuit is so small as can be permitted, therefore, that inner product is equivalent to the cosine value of the total of the phase-shifts of the aforementioned section, and is properly updated to the value adapted for the difference and fluctuation of the phase-shifts.

Therefore, the offset contained in the vector sum outputted by the vector sum outputting circuit can be accurately and stably suppressed like the fifth offset compensation device, even in case the characteristics of the aforementioned circuit and/or the section are accompanied by the deviations or in case the characteristics can be widely varied according to the environmental conditions, the aging or the like.

In the seventh offset compensation device according to the invention, the deviation monitor unit generates the vector signal by A/D-converting the result of processing applied to the vector sum and by performing a processing inverse to the processing in a digital area and then performing a quadrature-modulation.

Specifically, the hardware for the aforementioned processing is disposed at the downstream stage of the circuit for generating the vector sum and for compensating the offset, and the offset vector is sequentially updated on the basis of the aforementioned adaptive algorithm even in case the phase-shift and other characteristics of the hardware can fluctuate.

Therefore, the degree of freedom for the configuration of the device or system, to which the invention can be applied, is enhanced.

In the eighth offset compensating device according to the invention, the adaptive control unit determines an inner product of two vectors which make a common angle with respect to all axes of the vector space in a quadrant in the vector space where the two vectors to be determined in their inner product are individually positioned and which have a common absolute value.

Specifically, the aforementioned inner product is determined on the basis of the two vectors individually resembling the aforementioned two vectors.

Therefore, the procedure of the adaptive control can be simplified to improve the responsiveness as well as to reduce the throughput and the power.

In the ninth offset compensation device according to the invention, the adaptive control unit sets a step size $\mu$ to be applied to the adaptive control, to the larger value as the deviation or the absolute value of the increment vector is the larger.

Thus, the responsiveness of the adaptive control becomes the lower as the offset vector to be updated under the adaptive control converges the more into the preferred vector.

On the other hand, the responsiveness of the adaptive control to be made by the adaptive control unit just after the adaptive control unit starts or reopens its run is set high.

Therefore, the device and system, to which the invention is applied, can quickly shift to the steady state when the start or run is reopened.

In the tenth offset compensation device according to the invention, the adaptive control unit sets a step size $\mu$ to be applied to the adaptive control, to the larger value as the increment vector has the larger absolute value.

Thus, the responsiveness of the adaptive control becomes the lower as the offset vector to be updated under the adaptive control converges the more into the preferred vector.

On the other hand, the responsiveness of the adaptive control to be made by the adaptive control unit just after the adaptive control unit starts or reopens its run is set high.

Therefore, the device and system, to which the invention is applied, can quickly shift to the steady state when the start or run is reopened.

In the eleventh offset compensation device according to the invention, the deviation monitor unit smoothes the DC component the more on the basis of the weight having the larger changing rate to time series, as the deviation determined in advance or the absolute value of the increment vector is the larger, thereby to obtain the deviation as the result.

Thus, the responsiveness of the adaptive control becomes the lower as the offset vector to be updated under the adaptive control converges the more into the preferred vector.

On the other hand, the responsiveness of the adaptive control to be made by the adaptive control unit just after the adaptive control unit starts or reopens its run is set high.

Therefore, the device and system, to which the invention is applied, can quickly shift to the steady state when the start or run is reopened.

In the twelfth offset compensation device according to the invention, the adaptive control unit acts intermittently at a frequency for the compensation vector to be updated.

Specifically, the adaptive control unit either stands by without updating the compensation vector or stops, while the updating of the compensation vector unnecessary.

Therefore, as compared with the case, in case the adaptive control is steadily made, the power consumption is reduced, and the restrictions on the thermal design, assembly, and cost/size reduction are released.

In the thirteenth offset compensation device according to the invention, the adaptive control unit stops when the deviation determined in advance or the absolute value of the increment vector becomes lower than a predetermined lower limit.

Specifically, the deviation monitor unit performs no processing and consumes no power, while the offset correction vector converges under the aforementioned adaptive control into the proper vector.

Therefore, the power consumption by the device or system, to which the invention is applied, can be highly reliably and stably reduced.

In the fourteenth offset compensation device according to the invention, the dispersion monitor unit monitors the dispersion of the deviation determined in advance or the absolute value of the increment vector. The adaptive control unit stops when the dispersion becomes lower than a predetermined threshold value.

Specifically, the adaptive control unit acts not only for the period where the aforementioned deviation or the average of the absolute value of the increment vector is merely small but also for the period where the deviations or the absolute value of the increment vector increases/decreases for the predetermined wide range.

Therefore, after the offset vector was accurately converged into a proper vector, the consumption of the electric power due to the useless adaptive control can be highly reliably avoided so long as a factor to update the offset vector drastically does not occur.

In the fifteenth offset compensation device according to the invention, the deviation monitor unit monitors the deviation of the DC component with reference to the DC component superposed on the input signal.

Specifically, although the offset of the circuit for outputting the aforementioned vector sum is compensated, this vector sum contains the DC components superposed on the input signal to be inputted to that circuit.

Therefore, the offset on various circuits can be compensated.

In the sixteenth offset compensation device according to the invention, the quasi-offset monitor unit detects the instant when the average of the DC component superposed on the input signal becomes "0". The deviation monitor unit and the adaptive control unit start every time when the instant us detected by the quasi-offset monitor unit.

Specifically, irrespective of the average value of the DC components superposed on the input signal, the offset vector is more accurately updated by the adaptive control unit better than the case, in which the deviation monitor unit and the adaptive control unit steadily run.

Therefore, a flexible adaptation can be made for the various input signals and the aforementioned circuit configurations.

In the seventeenth offset compensation device according to the invention, the deviation monitor unit specifies the period for which the level of the component of the vector signal in a low range for the offset caused in the circuit to distribute is lower than a predetermined lower limit. The adaptive control unit stops for the period specified by the deviation monitor unit.

Specifically, the state where the offset vector converges in the preferred vector is discriminated on the basis of not only the DC components but the level of the components distributed in the desired band containing that of the DC components, so that the trial of the useless adaptive control unit is regulated so long as that state continues.

Therefore, flexible adaptation can be made for various processing modes to be taken by the aforementioned circuits.

In the eighteenth offset compensation device according to the invention, the demodulator generates two monitor signals by A/D-converting a modulated wave generated through two D/A converters individually corresponding to two quadrature channels and through a quadrature modulator arranged at the downstream stage of those D/A converters, and by quadrature-demodulating the converted wave. The intermission control unit intermits the feed of the modulated wave to the demodulator. The control unit suppresses an imbalance of the quadrature-modulator by extracting composite DC components individually contained in the two monitor signals for the period while the modulated wave is being fed, by extracting excess DC components individually contained in the two monitor signals for the period while the modulated wave is not fed, and by feeding back the difference for every the two channels between those composite DC components and excess DC components, individually to the two D/A converters.

Even if the components of the clock signal to be used for the aforementioned A/D conversion are superposed on the aforementioned two monitor signals, the components are extracted as excess DC components and are subtracted from the "difference to be fed back to the two D/A converters".

Even in case, therefore, the components of such clock signals have a high level or can widely change, the imbalance of the quadrature modulator can be stably and accurately suppressed.

In the nineteenth offset compensation device according to the invention, the demodulator generates two monitor signals by frequency-converting, A/D-converting and quadrature-demodulating a modulated wave generated through two D/A converters individually corresponding to two quadrature channels and through a quadrature modulator arranged at the downstream stage of those D/A converters. The local-frequency control unit sets the frequency of the local-frequency signal fed for the frequency conversion, at a predetermined value F and at a value ($=F \pm \Delta f$) different from the predetermined value F. The control unit suppresses an imbalance of the quadrature-modulator by determining excess DC components individually contained in the two monitor signals for the period while the frequency of the local-frequency signal is different from the predetermined value F, by determining composite DC components individually contained in the two monitor signals for the period while the frequency of the local-frequency signal is at the predetermined value F, and by feeding back the difference for every the two channels between those composite DC components and excess DC components, individually to the two D/A converters.

Even if the components of the clock signal to be used for the aforementioned A/D conversion are superposed on the aforementioned two monitor signals, the components are extracted as excess DC components on the basis of the frequency difference from the DC components due to the imbalance of the quadrature modulator, and are subtracted from the "difference to be fed back to the two D/A converters".

Even in case, therefore, the components of such clock signals have a high level or can widely change, the imbalance of the quadrature modulator can be stably and accurately suppressed.

In the twentieth offset compensation device according to the invention, the demodulator generates two monitor signals by frequency-converting and A/D-converting a modulated wave generated through two D/A converters individually corresponding to two quadrature channels and through a quadrature modulator arranged at the downstream stage of those D/A converters, on the basis of the local-frequency signal of a frequency ($=F\pm\Delta f$) different from a predetermined value F, and by quadrature-demodulating the modulated wave on the basis of a carrier of the frequency ($=f\pm\Delta f$) different from the predetermined value f. The control unit suppresses an imbalance of the quadrature modulator, and by feeding back the DC components individually contained in the two monitor signals, individually to the two D/A converters.

Even if the components of the clock signal to be used for the aforementioned A/D conversion are superposed on the aforementioned two monitor signals, the components are separated on the basis of the frequency difference from the DC components due to the imbalance of the quadrature modulator, so that they are not contained in the DC components thus fed back.

Even if, therefore, the components of the clock signal fed for the aforementioned A/D conversion are superposed at various levels on the aforementioned two monitor signals, the imbalance of the quadrature modulator can be stably and accurately suppressed.

In the twenty-first offset compensation device according to the invention, the demodulator generates two monitor signals by frequency-converting, A/D-converting and quadrature-demodulating a modulated wave generated through two D/A converters individually corresponding to two quadrature channels and through a quadrature modulator arranged at the downstream stage of those D/A converters. The local-frequency control unit sets the frequency of the local-frequency signal fed for the frequency conversion, at a predetermined value F and at a value ($=F\pm\Delta f$) different from the predetermined value F.

The control unit suppresses an imbalance of the quadrature modulator by setting the frequency of the carrier to be fed to the quadrature-demodulation, to a frequency ($=f\pm\Delta f$) different from a predetermined value f for the period while the frequency of the local-frequency signal is different from the predetermined value F, by feeding back the DC components individually contained in the two monitor signals, to the two D/A converters, by setting the frequency of the carrier to the predetermined value f, and by feeding back the DC components to the two D/A converters.

Even if the components of the clock signal to be served for the aforementioned A/D conversion are superposed on the aforementioned two monitor signals, the components are separated on the basis of the frequency difference from the DC components due to the imbalance of the quadrature modulator, so that they are not contained in the DC components thus fed back.

Even in case, therefore, such clock components have a high level or can widely vary, the imbalance of the quadrature modulator can be stably and accurately suppressed.

For the period to determine the aforementioned DC components, moreover, the suppression of the imbalance of the quadrature modulator is highly ensured. After the DC components were determined, both the frequency of the local-frequency signal to be served for the frequency conversion and the frequency of the carrier to be served for the quadrature demodulation are set at the specified values. As a result, the strain compensation to be performed on the premise of those frequencies is accurately achieved over a wide band.

In the twenty-second offset compensation device according to the invention, the demodulator generates two monitor signals by frequency-converting, A/D-converting and quadrature-demodulating a modulated wave generated through two D/A converters individually corresponding to two quadrature channels and through a quadrature modulator arranged at the downstream stage of those D/A converters. The local-frequency control unit sets the frequency of the local-frequency signal fed for the frequency conversion, sequentially at a value ($=F\pm\Delta f$) different from a predetermined value F, and at the predetermined value. The control unit suppresses an imbalance of the quadrature modulator by setting the frequency of the carrier to be fed to the quadrature-demodulation, to a frequency ($=f\pm\Delta f$) different from a predetermined value f for the period while the frequency of the local-frequency signal is different from the predetermined value F, by feeding back the DC components individually contained in the two monitor signals, to the two D/A converters, by determining excess DC components as the difference between composite DC components individually contained in the two monitor signals while feeding back the DC components to the two D/A converters, when the frequency of the local-frequency signal becomes the predetermined value F, and by feeding back the difference for every the two channels between the composite DC components individually contained in the succeeding two monitor signals and the excess DC components, to the two D/A converters.

In the different thus fed back, specifically, the components of the clock signals to be A/D-converted are not contained as the DC components in the aforementioned two monitor signals, but the degree of imbalance of the quadrature modulator according to the temperature or the aging is flexibly reflected.

According this embodiment, therefore, so long as the components of the clock signals superposed as the DC components on the aforementioned two monitor signals are deemed to have a constant level, the wide change in and the aging of the temperature or other environments are flexibly adapted, and the imbalance of the quadrature modulator is accurately and stably suppressed.

In the twenty-third offset compensation device according to the invention, the frequency control unit for keeping the value $\Delta f$ is kept at (fmax−fc) or more or (fmin−fc) or less, for the maximum and minimum frequencies fmax and fmin of the occupied band of the modulated wave and for the frequency fc of the carrier signal contained in the modulated wave due to the imbalance.

Specifically, the components of the clock signals to be A/D-converted and superposed on the two monitor signals, and the DC components to be superposed on those monitor signals due to the imbalance of the quadrature modulator are distributed under the aforementioned frequency conversion in the different band irrespective of the occupied band of the modulated waves, so that they can be reliably separated by the filtration suited for the difference in those bands.

Therefore, the imbalance of the quadrature modulator is stably and accurately suppressed even in case the occupied band of the modulated wave can widely change.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 21 is a block diagram showing an example of the configuration of a radio transmission device equipped with a quadrature modulator for compensating an offset; and FIG. 22 is a block diagram showing another example of the configuration of the radio transmission device equipped with the quadrature modulator for compensating an offset.

DESCRIPTION OF THE PREFERRED EMBODIMENTS

Embodiment of the invention will be described in detail with reference to the accompanying drawings.

First Embodiment

Figure 1:
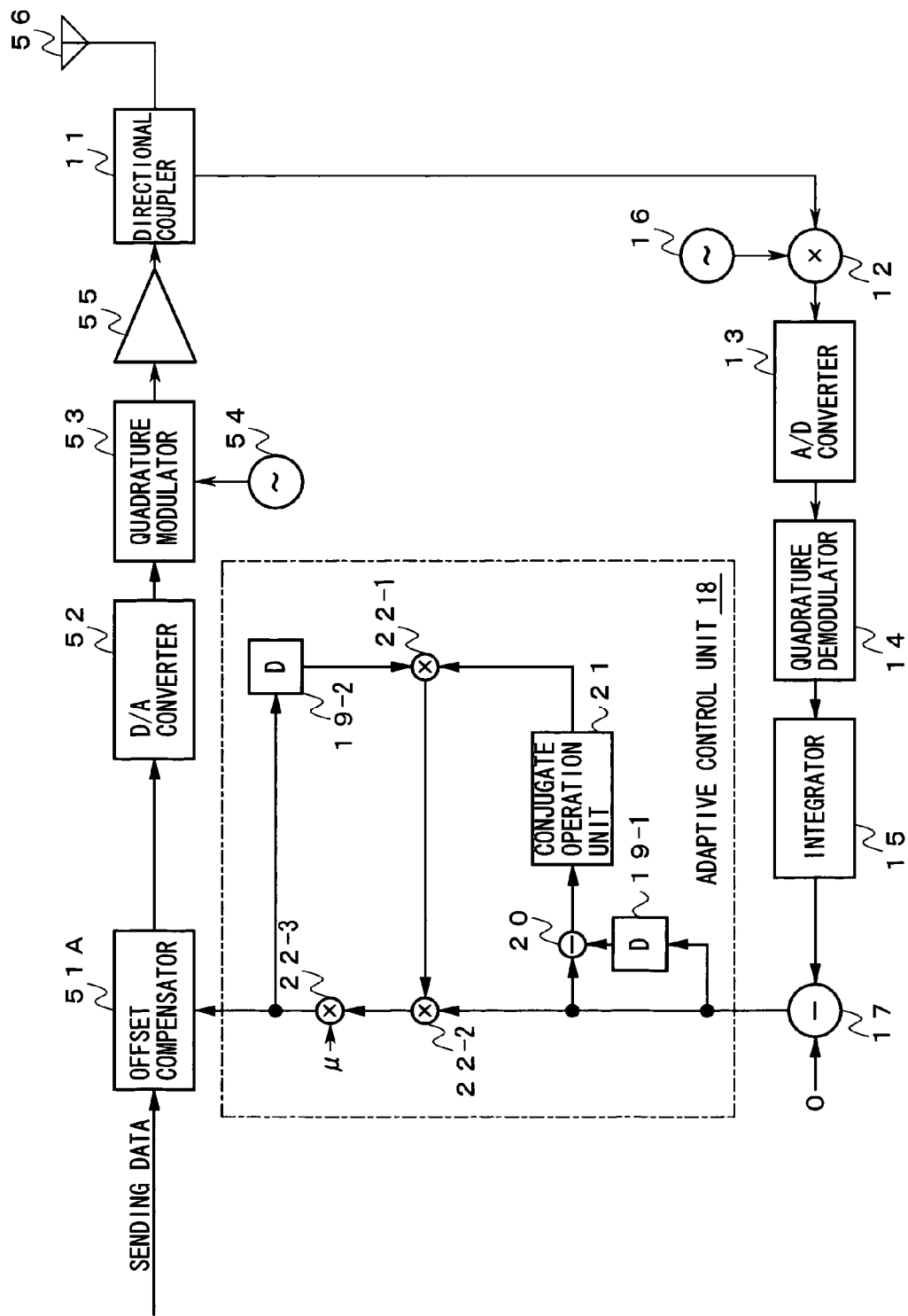
FIG. 1 is a block diagram showing a first embodiment of the present invention.

FIG. 1 is a block diagram showing the first embodiment of the invention.

This embodiment is provided with the following components:

an offset compensator 51A provided in place of the aforementioned offset compensator 51;

a directional coupler 11 arranged in the feeding path of an antenna 56;

a mixer 12, an A/D converter 13, a quadrature demodulator 14 and an integrator 15 cascaded with the monitor terminal of the directional coupler 11;

an oscillator 16 having an output connected with the local-frequency input of the mixer 12;

a subtracter 17 having its one input connected with the output of the integrator 15 and its other input set to "0" or the target value of the offset component to be compensated; and an adaptive control unit 18 cascaded with the output of the subtracter 17 and having an output connected with the control input of the offset compensator 51A.

On the other hand, the adaptive control unit 18 is composed of the following elements:

a delayer (D) 19-1 having an input connected with the output of the subtracter 17;

a subtracter 20 having its one input connected with the output of the subtracter 17 and its other input connected with the output of the delayer 19-1;

a conjugate operation unit 21 cascaded with the output of the subtracter 20;

a multiplier 22-1 having its one input connected with the output of the conjugate operation unit 21;

a multiplier 22-2 having its one input connected with the output of the subtracter 17 and its other output connected with the output of the multiplier 22-1;

a multiplier 22-3 having its one input connected with the output of the multiplier 22-2 and its other input given a step size μ and having its output connected with the control input of the offset compensator 51A; and a delayer (D) 19-2 having its input connected with the output of the multiplier 22-3 and its output connected with the other input of the multiplier 22-1.

The actions of the first embodiment of the invention are described with reference to FIG. 1.

For simplicity, the section from the output of the offset compensator 51A through a D/A converter 52 and a quadrature modulator 53 to the output terminal of a power amplifier 55 will be called the "forward line", and the section from the monitor terminal of the directional coupler 11 through the mixer 12 to the input of the A/D converter 13 will be called the "feedback line".

In response to the local-frequency signal generated by the oscillator 16, the mixer 12 frequency-converts the aforementioned modulated wave signal acquired through the directional coupler 11, thereby to generate a monitored signal, in which the component of the modulated wave signal is indicated by an intermediate frequency band or a base band.

The A/D converter 13 converts the monitored signal into a digital signal, and the quadrature demodulator 14 quadrature-demodulates the digital signal thereby to generate quadrature-monitored signals i and q corresponding to the aforementioned I-channel and Q-channel, respectively.

The integrator 15 smoothes those quadrature-monitored signals i and q on a complex plane thereby to extract the offset components contained in the quadrature-monitored signals i and q. The subtracter 17 determines deviations $Rx_{offset[n]}$ of those offset components corresponding to the aforementioned target value "0" in the order of time series n.

The delayer 19-1 and the subtracter 20 determine the increment $\delta_{[n]}(=Rx_{offset[n]}-Rx_{offset[n-1]})$ of the deviations $Rx_{offset[n-1]}$ and $Rx_{offset[n]}$ thus determined, in the order of the time series n. The conjugate operation unit 21 determines such a conjugate increment $\delta'_{[n]}$ as is conjugate on the complex plane with respect to that increment $\delta_{[n]}$.

On the other hand, the delayer 19-2 holds preceding offset compensation vector $CMP_{[n-1]}$, given to the offset compensator 51A and the multiplier 22-1 determines an outer product $u_{[n]}$ of the offset compensation vector $CMP_{[n-1]}$ and the aforementioned conjugate increment $\delta'_{[n]}$ in the order to the time series n. Here, this outer product $u_{[n]}$ is mathematically equivalent to the "inner product of the aforementioned offset compensation vector $CMP_{[n-1]}$ and the increment $\delta_{[n]}$". For simplicity, it will be assumed that the outer product $u_{[n]}$ is the "inner product $u_{[n]}$", and that a value "$e^{j0}$" is applied as an initial value $u_{[0]}$.

The multipliers 22-2 and 22-3 update an offset compensation vector $CMP_{[n]}$ sequentially to the outer product, as expressed with their increment $\delta_{[n]}$, the aforementioned deviation $Rx_{offset[n]}$ and the constant step size $\mu$ of a preset scalar quantity, by the following Equation:

$$CMP_{[n]} = -\mu \times Rx_{offset[n]} \times u_{[n]} \qquad (1).$$

The offset compensator 51A updates the outer product (=$Tx_{offset[n+1]}$), as expressed by the following Equation, of the offset compensation vector $CMP_{[n]}$ given by the multiplier 22-3 (of the adaptive control unit 18) and the offset vector $Tx_{offset[n]}$ set on the basis of the offset compensation vector $CMP_{[n-1]}$ preceding the offset compensation vector $CMP_{[n]}$:

$$Tx_{offset[n+1]} = Tx_{offset[n]} + CMP_{[n]} \qquad (2).$$

Moreover, the offset compensator 51A adds the offset vector $Tx_{offset[n+1]}$ to two quadratic "modulated signal" indicates the aforementioned sending data, and hands over the sum to the D/A converter 52.

Here, the aforementioned offset compensation vector $CMP_{[n-1]}$ implies the mode, to which the offset vector $Tx_{offset[n-1]}$ previously applied to the forward line through the offset compensator 51A is to be updated.

On the other hand, the aforementioned increment $\delta_{[n]}$ implies the fluctuation which is caused in the deviation $Rx_{offset[n-1]}$ obtained in the feedback line by the application of the offset vector $Tx_{offset[n]}$ in place of that offset vector $Tx_{offset[n-1]}$ to the forward line.

Specifically, the inner product $u_{[n]}$ of the aforementioned offset compensation vector $CMP_{[n-1]}$ and the increment $\delta_{[n]}$ corresponds to the cosine value of the total $\phi$ of the phase-shifts of the forward line and the feedback line, and is suitably updated to the value adapted for the difference or fluctuation of those phase-shifts.

As expressed by the aforementioned Equations (1) and (2), moreover, the aforementioned offset vector $Tx_{offset[n+1]}$ is updated on the basis of the adaptive algorithm to minimize the expectation value of the product of the inner product $u_{[n]}$ and the latest deviation $Rx_{offset[n]}$ and is kept at a value flexibly and stably adapted for the deviation and fluctuation of the phase-shift of the feedback line.

According to this embodiment, therefore, a modulated wave adapted for the desired modulation scheme or the constellation is stably obtained for the output of the quadrature modulator 53 while suppressing the spuriousness in high accuracy, not only in case the characteristics of the forward line and the feedback line are accompanied by the deviations but also in case the characteristics are widely varied according to the environmental conditions or the aging.

In this embodiment, the subtracter 17 is given the aforementioned target value "0".

Figure 2:
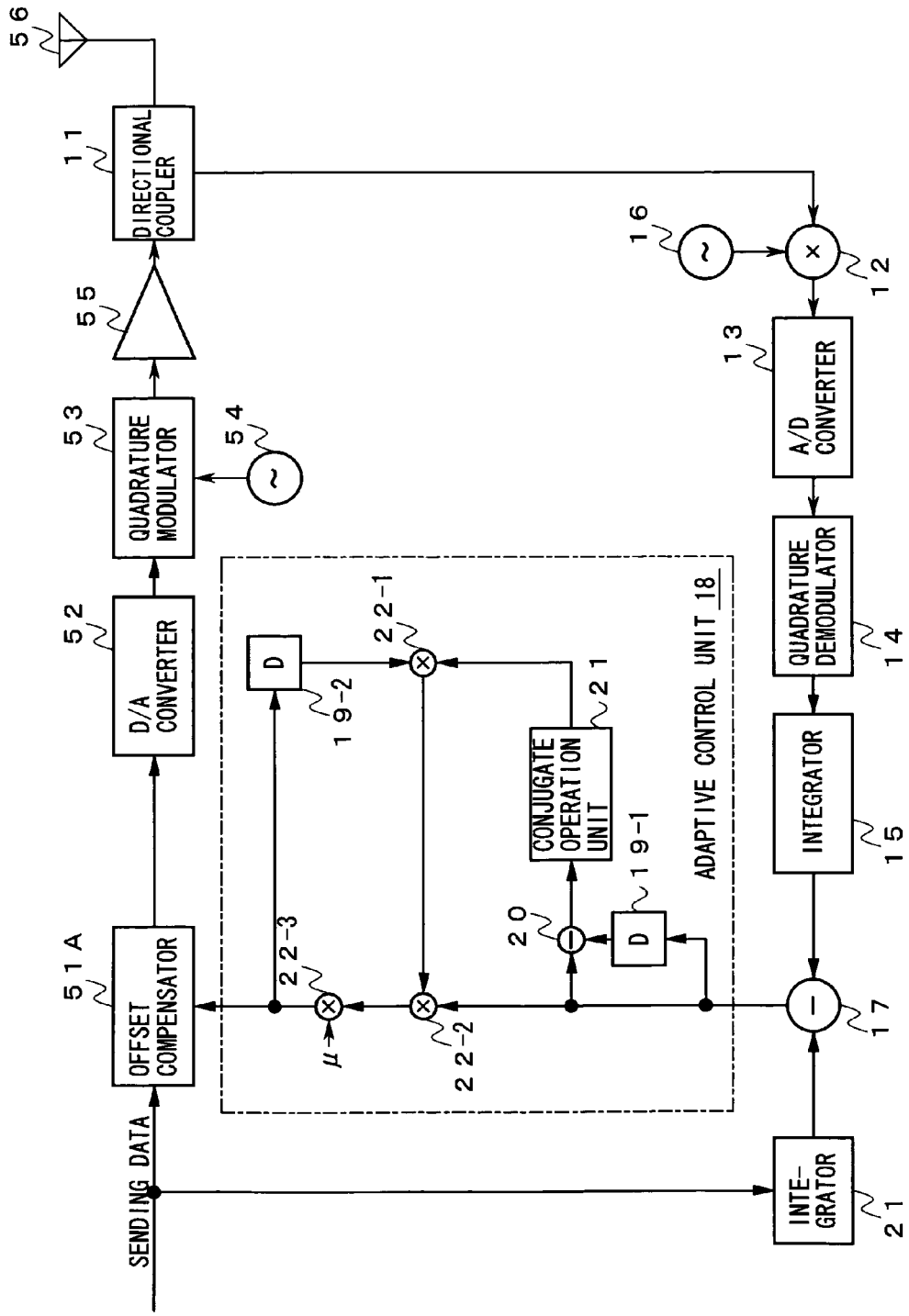
FIG. 2 is a block diagram showing another configuration of the first embodiment of the present invention.

As shown in FIG. 2, however, the present invention can also be applied to a device for generating the modulated wave, in which the component of the carrier wave signal resides, as a result that such target value is given by the integrator 21 for detecting the DC component contained in the sending data.

Second Embodiment

Figure 3:
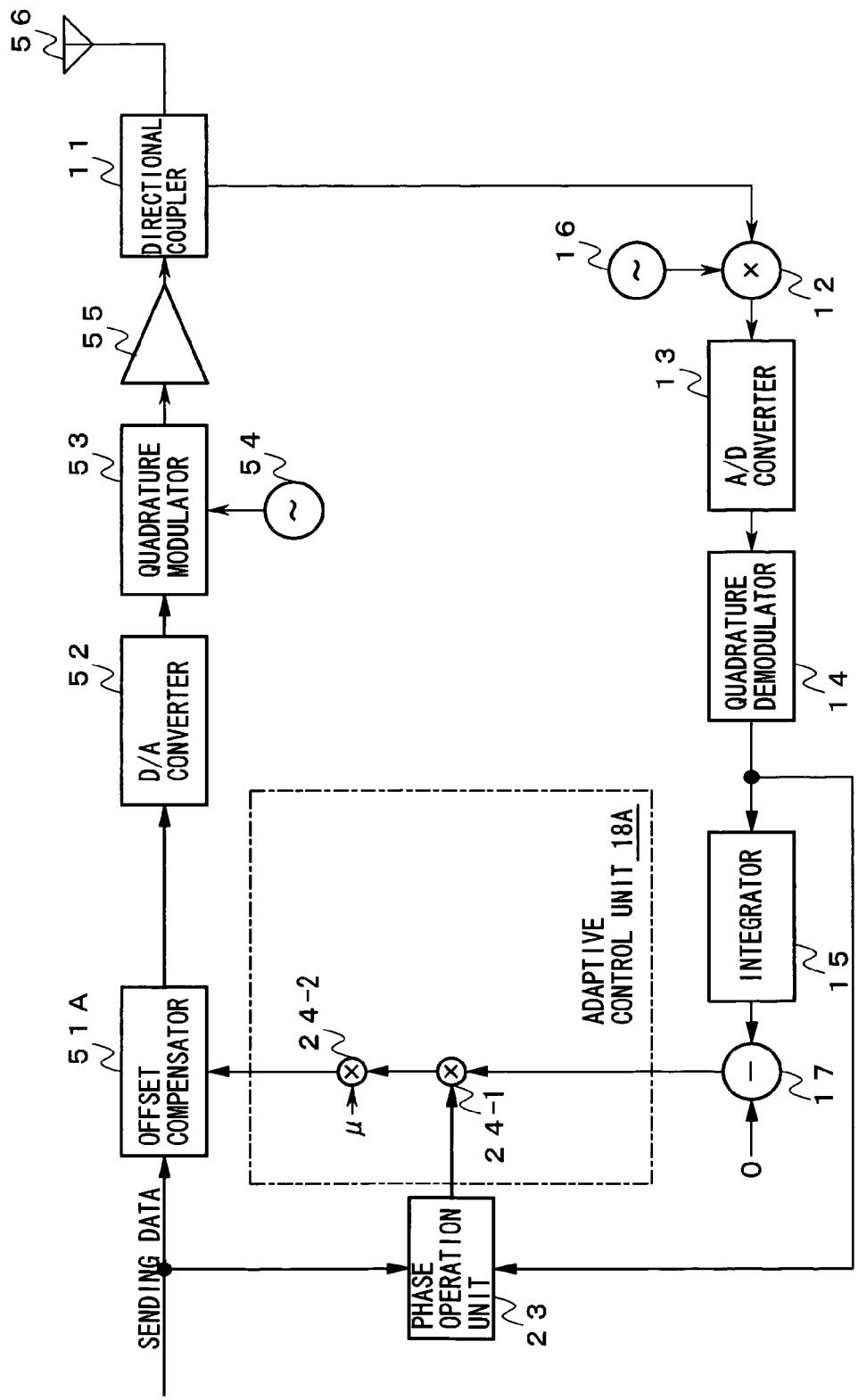
FIG. 3 is a block diagram showing a second embodiment of the present invention.

FIG. 3 shows the second embodiment of the present invention.

This embodiment is provided with the following components:

a phase operation unit 23 having its one input given the aforementioned sending data and its other input connected with the output of the quadrature demodulator 14; and an adaptive control unit 18A connected with the output of the phase operation unit 23 and provided in place of the aforementioned adaptive control unit 18.

The adaptive control unit 18A is configured to have the following components:

a multiplier 24-1 having its one input connected with the output of the subtracter 17 and its other input connected with the output of the aforementioned phase operation unit 23; and a multiplier 24-2 having its one input connected with the output of the multiplier 24-1 and its other input fed with the aforementioned step size $\mu$ and having its output connected with the control input of the offset compensator 51A.

The actions of the second embodiment of the invention are described with reference to FIG. 3.

The phase operation unit 23 generates two delayed sending data individually corresponding to two sending data to be transmitted in parallel through the I-channel and the Q-channel, by giving those transmission data in parallel a delay equal to the sum of the required transmission time periods of the forward line and the feedback line.

Moreover, the phase operation unit 23 determines, in place of the aforementioned inner product $u_{[n]}$, the inner product $u_{[n]}$ of a first vector indicating those delayed sending data and a second vector indicating the quadrature-monitored signals i and q generated by the quadrature demodulator 14, as has been described hereinbefore.

The multipliers 24-1 and 24-2 update the offset vector $Tx_{offset[n]}$ by performing arithmetic operation expressed by Equations (1) and (2) with respect to the inner product $u_{[n]}$, the deviation $Rx_{offset[n]}$ determined by the subtracter 17 and the aforementioned step size $\mu$ repeatedly, and gives the offset vector $Tx_{offset[n]}$ to the offset compensator 51A.

According to this embodiment, therefore, so long as the aforementioned inner product $u_{[n]}$ is determined in the desired accuracy and responsiveness by the phase operation unit 23, like the aforementioned first embodiment, the modulated wave adapted for the desired modulation scheme or the constellation is stably obtained for the output of the quadrature modulator 53 while suppressing the spuriousness in high accuracy, not only in case the characteristics of the forward line and the feedback line are accompanied by the deviations but also in case the characteristics are widely varied according to the environmental conditions or the aging.

Third Embodiment

Figure 4:
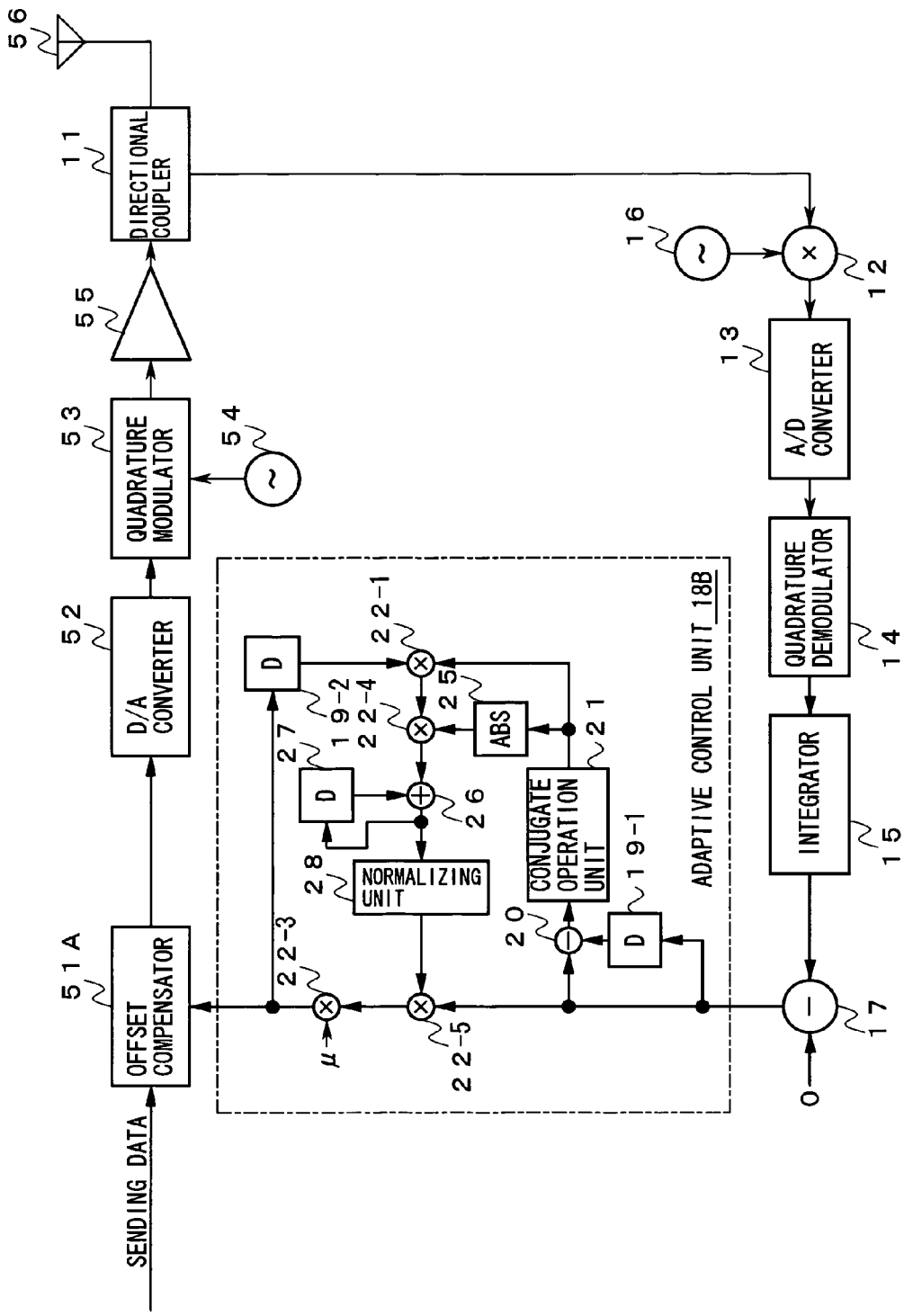
FIG. 4 is a block diagram showing a third embodiment of the present invention.

FIG. 4 is a block diagram showing the third embodiment of the present invention.

This embodiment is configured to include an adaptive control unit 18B characterized to have the following components, in place of the aforementioned adaptive control unit 18:

an absolute value calculation unit (ABS) 25 having its input connected with the output of the conjugate operation unit 21;

a multiplier 22-4 having its one input connected with the output of the absolute value calculation unit 25 and its other input connected with the output of the aforementioned multiplier 22-1;

an adder 26 having one its one input connected with the output of the multiplier 22-4;

a delayer (D) 27 having its input connected with the output of the adder 26 and its output connected with the other input of the adder 26;

a normalizing unit 28 having its input connected with the output of the adder 26: and a multiplier 22-5 having its one input connected with the output of the normalizing unit 28 and its other input connected with the output of the subtracter 17, and having its output connected with not the output of that subtracter 17 but one input of the multiplier 22-3.

The actions of the third embodiment of the invention are described with reference to FIG. 4.

This embodiment is characterized by the following processing procedure to be performed in the adaptive control unit 18B.

The absolute value calculation unit 25 calculates the absolute value $A(=|\delta'_{n[n]}|)$ of the conjugate increment $\delta'_{[n]}$ calculated by the conjugate operation unit 21. The multiplier 22-4 calculates a quasi-inner product $U_{[n]}$ by multiplying that absolute value A and the inner product $u_{[n]}$ calculated by the multiplier 22-1. The delayer 27 and the adder 26 update a vector (as will be called the "integrated vector"), which has been previously determined by the adder 26, by integrating the quasi-inner product $U_{[n]}$ on that vector. The normalizing unit 28 determines a normalized inner product $u_{opt[n]}$ by normalizing the absolute value of the integrated vector to a desired value (as assumed as "1" for simplicity). The multipliers 22-5 and 22-3 update the offset compensation vector $CMP_{[n]}$ by repeating the arithmetic operations, as expressed by Equation (3) replacing the aforementioned Equation (1), repeatedly in the order of the time series n, and hands over the offset compensation vector $CMP_{[n]}$ to the offset compensator 51A:

$$CMP_{[n]} = -\mu \times Rx_{offset[n]} \times u_{opt[n]} \quad (3).$$

This absolute value of this normalized inner product $u_{opt[n]}$ is prevented from becoming excessively small or large in the procedure, where the value of the offset vector $Tx_{offset[n]}$ converges to a proper value under the adaptive control of the adaptive control unit 18B, because the absolute value is normalized although it is multiplied by the absolute value $A(=|\delta'_{[n]}|)$ of the conjugate increment $\delta'_{[n]}$ and because the aforementioned integral vector is integrated with the quasi-inner product $U_{[n]}$ by the delayer 27 and the adder 26.

Even in the state where the convergence of the offset vector $Tx_{offset[n]}$ has proceeded under the adaptive control, therefore, the delay in the useless convergence, as might otherwise be caused by the excessively small absolute value of the aforementioned inner product $u_{[n]}$, can be avoided to compensate the offset stably and accurately.

Fourth Embodiment

Figure 5:
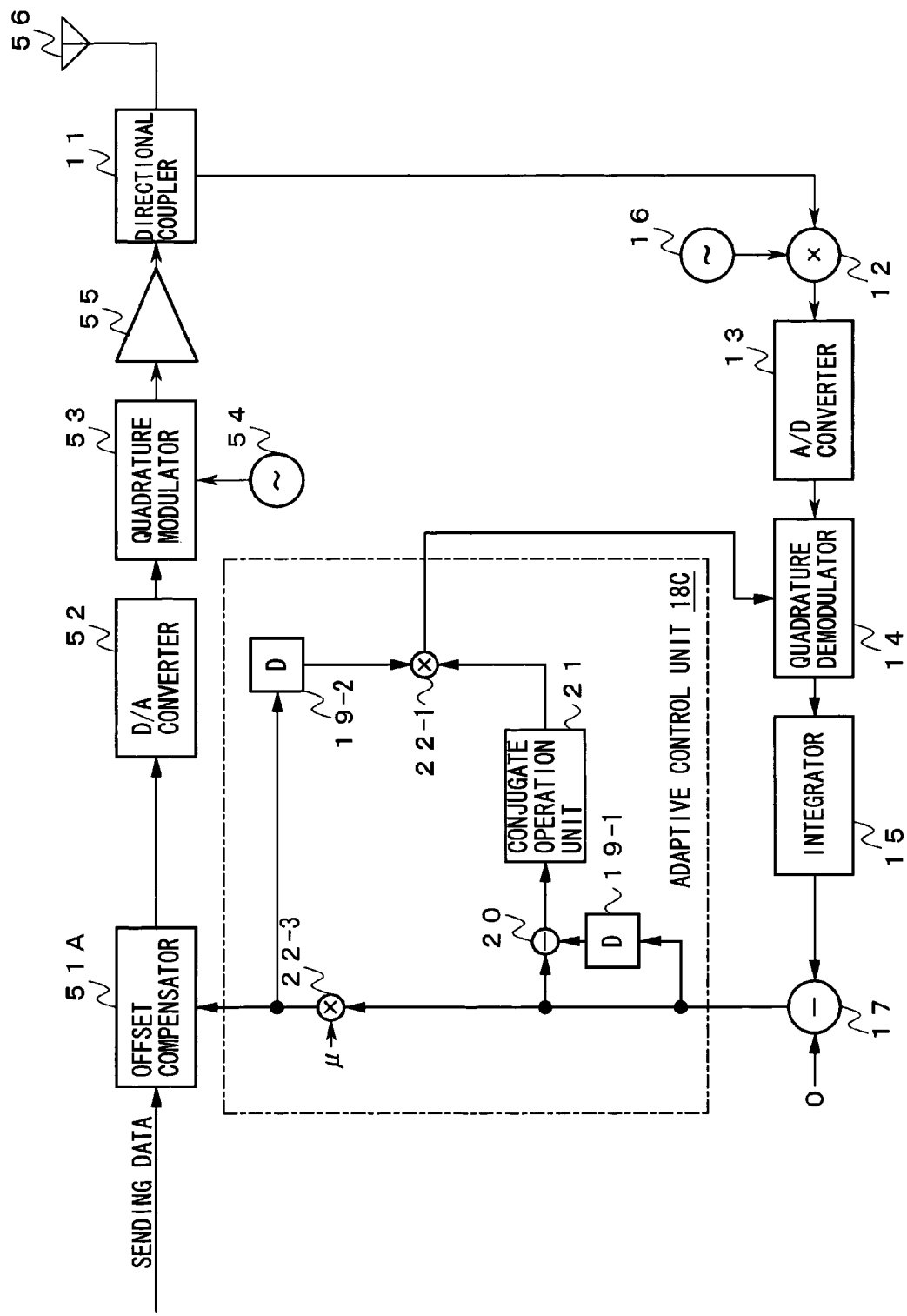
FIG. 5 is a block diagram showing a fourth embodiment of the present invention.

FIG. 5 is a block diagram showing the fourth embodiment of the present invention.

This embodiment is configured to have an adaptive control unit 18C in place of the adaptive control unit 18 such that the adaptive control unit 18C has its specific output connected with the offset input of the quadrature demodulator 14.

The adaptive control unit 18C is configured, as follows:
the multiplier 22-2 is dispensed with; and
the output of the multiplier 22-1 is connected with the offset input of the aforementioned quadrature demodulator 14.

The actions of the fourth embodiment of the invention are described with reference to FIG. 5.

In the adaptive control unit 18C, the multiplier 22-1 determines the inner product $u_{[n]}$ as in the aforementioned first embodiment, and hands over the inner product $u_{[n]}$ to the quadrature demodulator 14. On the other hand, the multiplier 22-3 updates the offset compensation vector $CMP_{[n]}$ on the basis of the adaptive algorithm to minimize the expectation value of only the latest deviation $Rx_{offset[n]}$ irrespective of the inner product $u_{[n]}$, and hands over the offset compensation vector $CMP_{[n]}$ to the offset compensator 51A.

On the other hand, the quadrature demodulator 14 generates quadrature-monitored signals I and Q by subtracting the corresponding components of the aforementioned inner product $u_{[n]}$ from the quadrature-monitored signals i and q generated as in the aforementioned first embodiment, and hands over those quadrature-monitored signals I and Q to the integrator 15.

Thus in this embodiment, the inner product $u_{[x]}$ is fed back directly to the quadrature demodulator 14. Under the adaptive control made on the basis of the simple adaptive algorithm to minimize the expectation value of only the latest deviation $Rx_{offset[n]}$, therefore, the proper offset vector $Tx_{offset[n]}$ is fed as in the first embodiment to the offset compensator 51A.

Fifth Embodiment

Figure 6:
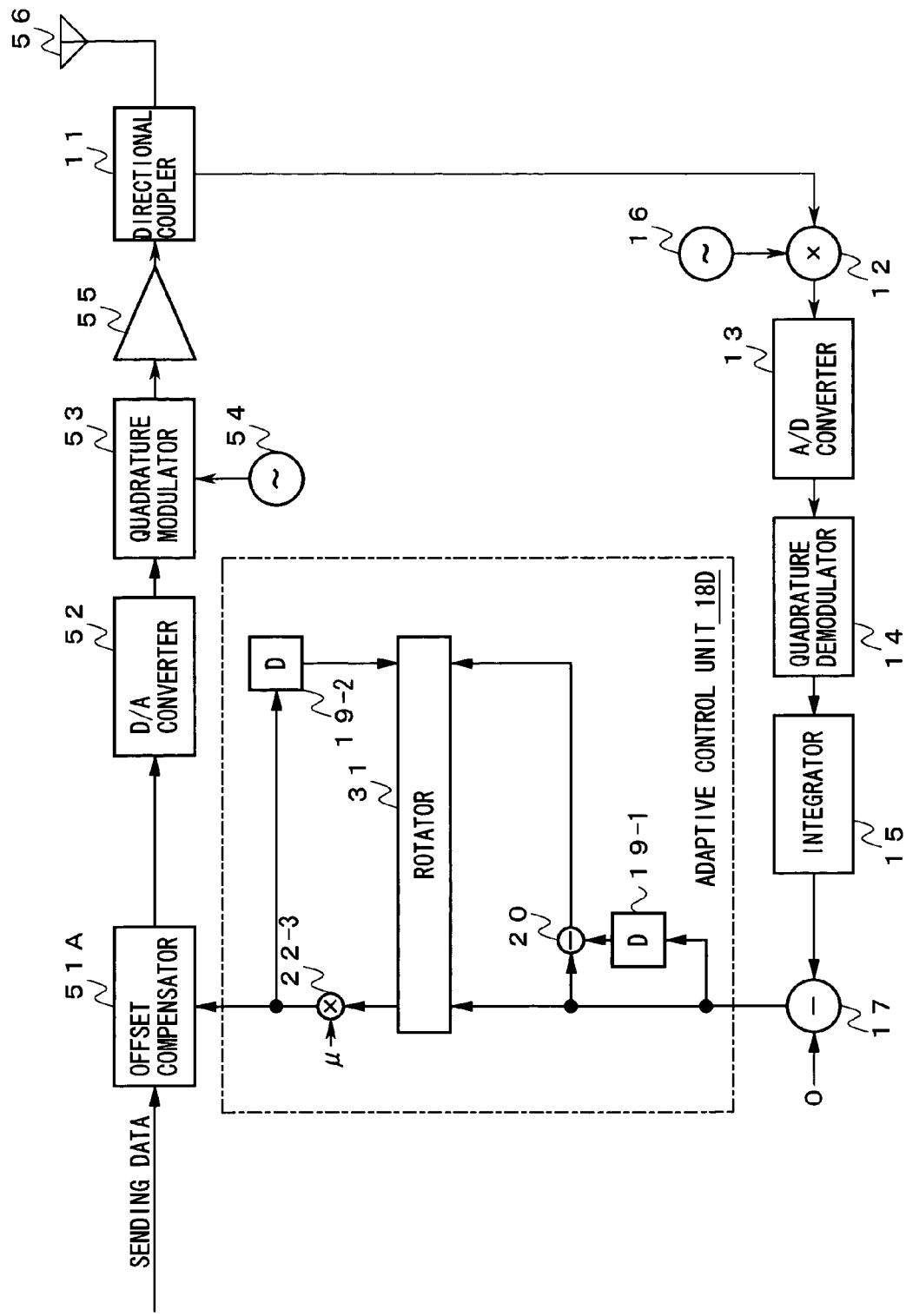
FIG. 6 is a block diagram showing a fifth embodiment of the present invention.

FIG. 6 is a block diagram showing the fifth embodiment of the present invention.

This embodiment is provided with an adaptive control unit 18D in place of the aforementioned adaptive control unit 18, and the adaptive control unit 18D is configured, as follows:

the conjugate operation unit 21 and the multipliers 22-1 and 22-2 are dispensed with: and these conjugate operation unit 21 and multipliers 22-1 and 22-2 are replaced by a rotator 31.

The actions of the fifth embodiment of the invention are described with reference to FIG. 6.

In the adaptive control unit 18D, the rotator 31 calculates the inner product $u_{[n]}$ in place of the aforementioned inner product $u_{[n]}$ by performing a complex operation, as expressed by the following Equation (4), on the increment $\delta_{[n]}$ given by the subtracter 20 as in the aforementioned first embodiment and the offset compensation vector $CMP_{[n-1]}$ outputted by the delayer 19-2:

$$u_{[n]} = (1/2) \cdot \text{sgn}(CMP_{[n-1]}) \times \text{sgn}(\delta_{[n]})^* \quad (4)$$

$$\text{sgn}(x+jy) = \begin{bmatrix} -1 - j(x<0, y<0) \\ -1 + j(x<0, y \geq 0) \\ +1 - j(x \geq 0, y<0) \\ +1 + j(x \geq 0, y \geq 0) \end{bmatrix}.$$

Moreover, the rotator 31 hands over to the multiplier 22-3 the outer product (corresponding to the vector product other than the step size μ contained in the right side of the aforementioned Equation (1)) of the deviation $Rx_{offset[n]}$ determined by the subtracter 17 and the aforementioned inner product $u_{[n]}$.

Thus, according to this embodiment, the calculation of the inner product $u_{[n]}$ to be referred to the updating of the offset compensation vector CMP$_{[n]}$ is simplified, as expressed by the aforementioned Equation (4), and the configuration of the hardware is simplified.

Sixth Embodiment

Figure 7:
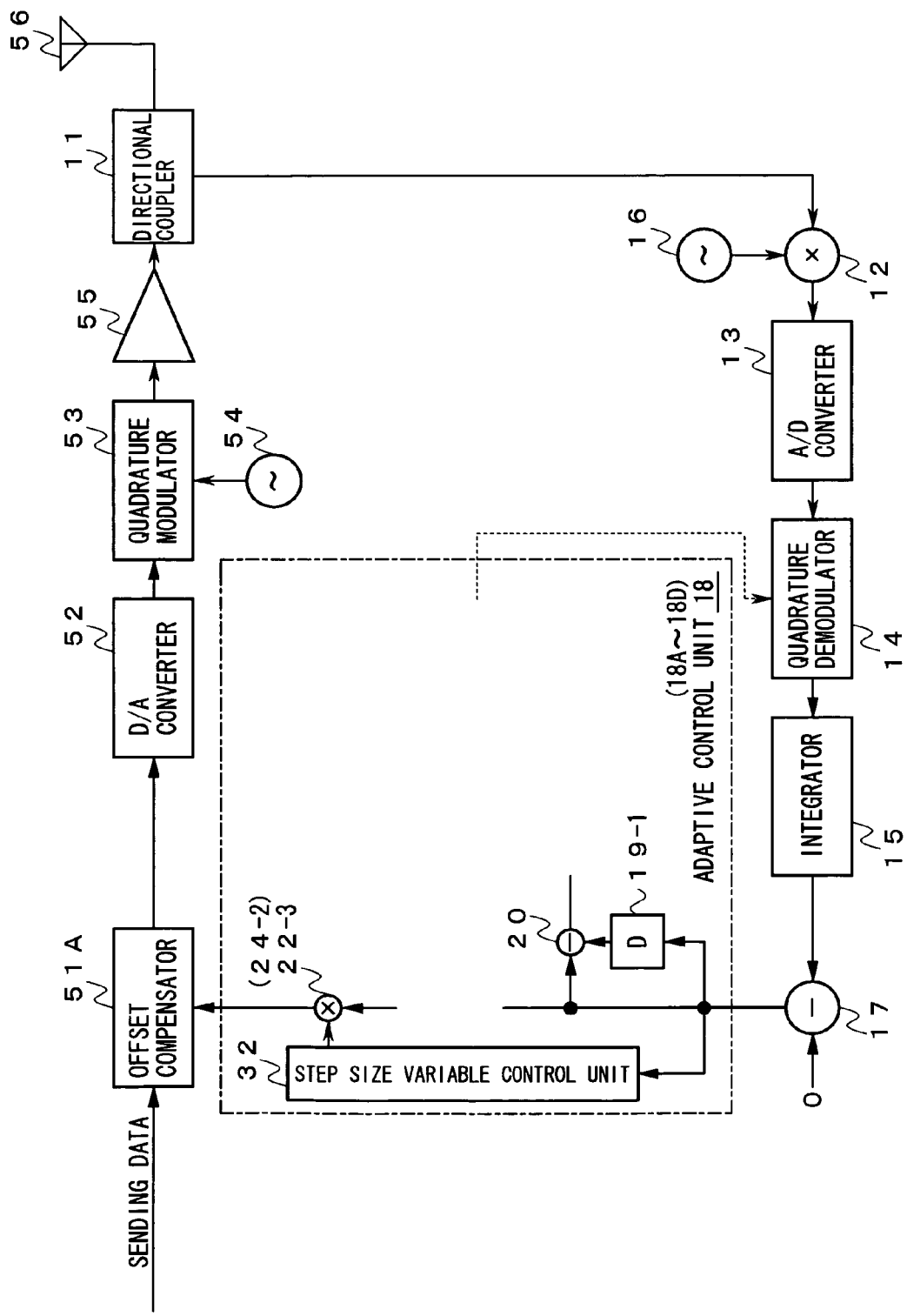
FIG. 7 is a block diagram showing a sixth embodiment of the present invention.

FIG. 7 is a block diagram showing the sixth embodiment of the present invention.

This embodiment is configured such that the adaptive control unit 18 (18A to 18D) is equipped with a "step size variable control unit 32 having its input connected with the output of the aforementioned subtracter 17 and its output connected with the other input of the multiplier 22-3 (24-2).

The actions of the sixth embodiment of the invention are described with reference to FIG. 7.

This embodiment is characterized in that the step size μ is set in the following manner.

The step size variable unit 32 monitors the deviation Rx$_{offset[n]}$ determined by the subtracter 17, and sets the step size μ to the larger value for the larger deviation Rx$_{offset[n]}$ and to the smaller value for the smaller deviation Rx$_{offset[n]}$.

Specifically, the rate of the adaptive control to update the offset vector Tx$_{offset[n]}$ is the higher for the larger deviation Rx$_{offset[n]}$ and the lower for the smaller value.

According to this embodiment, therefore, the offset compensation at the starting time and of the case, in which the characteristics of the forward line and the feedback line fluctuate, is realized at a higher rate than that of the case, in which the step size μ is constant, thereby to avoid such a fluctuation of the useless offset as might otherwise be caused by noises or the like having reached the forward line and the feedback line.

Seventh Embodiment

Figure 8:
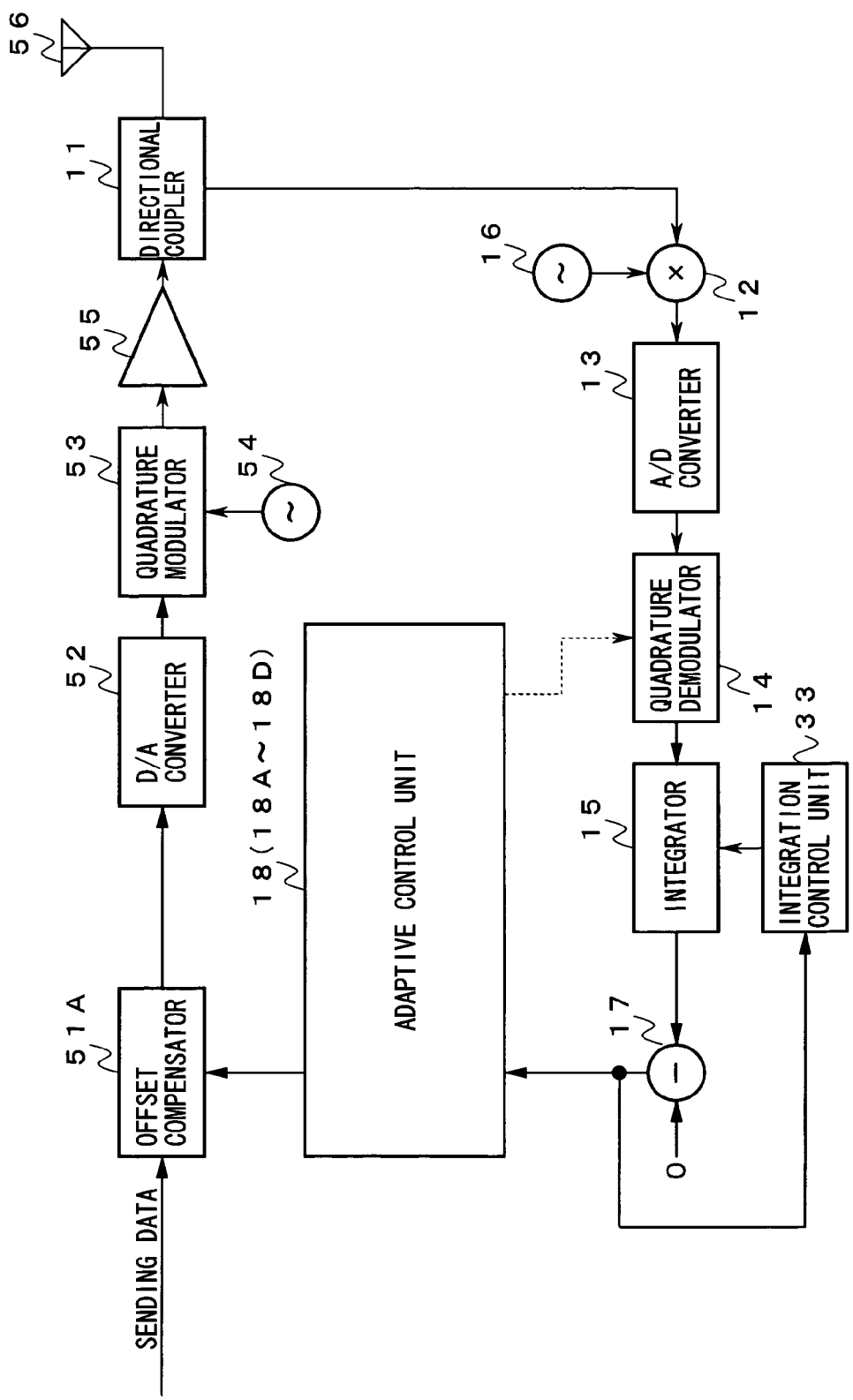
FIG. 8 is a block diagram showing a seventh embodiment of the present invention.

FIG. 8 is a block diagram showing the seventh embodiment of the present invention.

This embodiment is provided with an integration control unit 33 having its input connected with the output of the subtracter 17 and its output connected with the control input of the integrator 15.

The actions of the seventh embodiment of the invention are described with reference to FIG. 8.

This embodiment is characterized by the following procedure to be associatively performed by the integration control unit 33 and the integrator 15.

The integration control unit 33 monitors the deviation Rx$_{offset[n]}$ determined by the subtracter 17, and instructs the integrator 15 the shorter interval for the larger deviation Rx$_{offset[n]}$ but the longer interval for the smaller deviation Rx$_{offset[n]}$.

The integrator 15 determines the offset component contained in the quadrature-monitored signals i and q (I and Q) by smoothing the quadrature-monitored signals i and q (I and Q) for every interval of the lengths thus instructed by the integration control unit 33.

Specifically, the rate of the adaptive control to update the offset vector Tx$_{offset[n]}$ becomes the higher for the larger deviation Rx$_{offset[n]}$ but the lower for the smaller value.

According to this embodiment, therefore, the offset compensation at the starting time and of the case, in which the characteristics of the forward line and the feedback line fluctuate, is realized at a higher rate than that of the case, in which the length of the aforementioned interval is constant, thereby to avoid such a fluctuation of the useless offset as might otherwise be caused by noises or the like having reached the forward line and the feedback line at the steady time.

Eighth Embodiment

Figure 9:
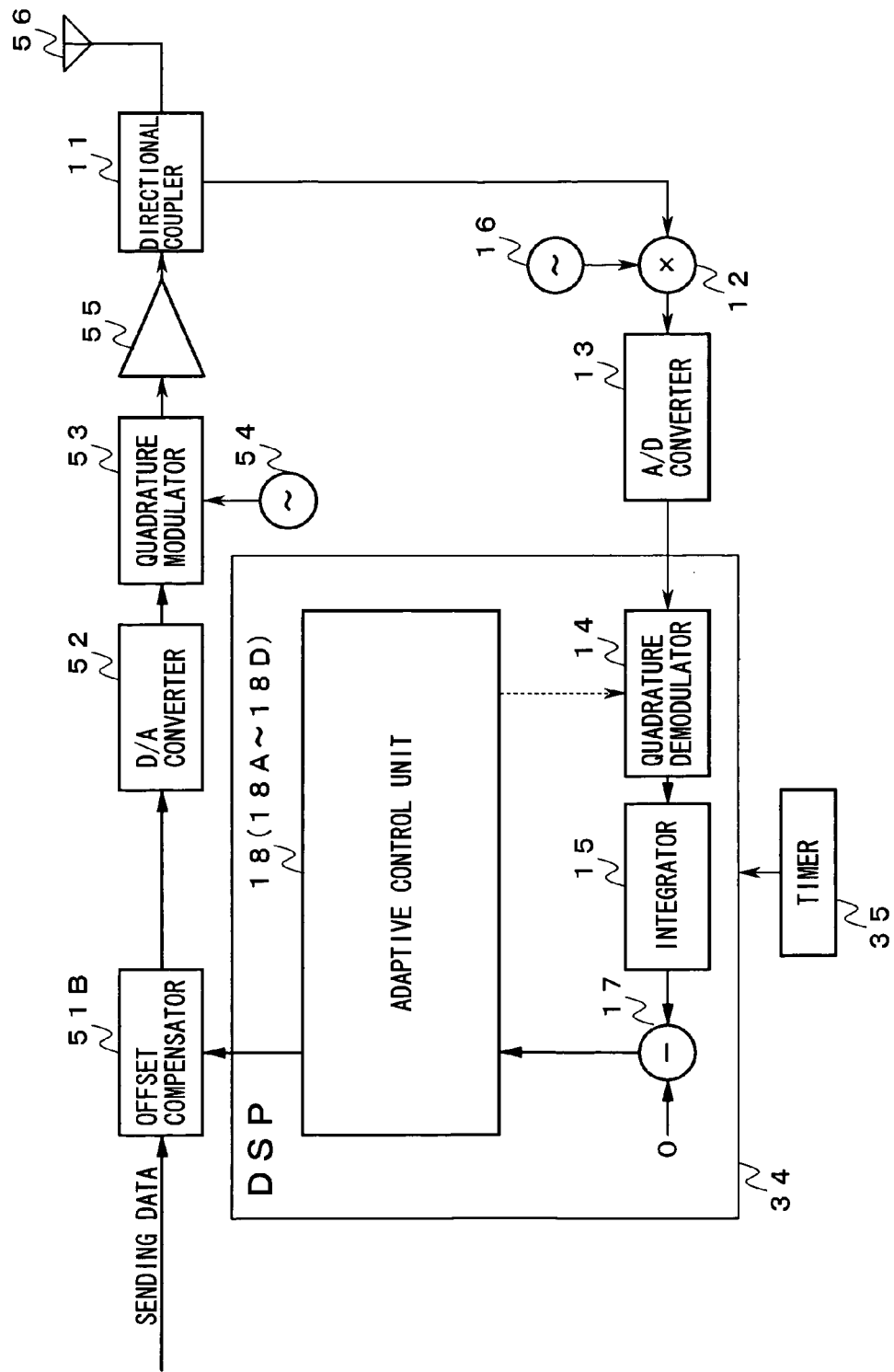
FIG. 9 is a block diagram showing an eighth embodiment of the present invention.

FIG. 9 is a block diagram showing the eighth embodiment of the present invention.

This embodiment is configured, as follows:

the offset compensator 51A is replaced by an offset compensator 51B;

the quadrature demodulator 14, the integrator 15, the subtracter 17 and the adaptive control unit 18 (18A to 18D) are configured as a firmware to be executed by a single DSP (Digital Signal Processor) 34; and the embodiment is provided with a timer 35 having its output connected with the control terminal of the DSP 34.

The actions of the eighth embodiment of the invention are described with reference to FIG. 9.

The offset compensator 51B updates the offset vector Tx$_{offset[n]}$, which is set on the basis of the offset compensation vector CMP$_{[n]}$ preceding the offset compensation vector CMP$_{[N]}$ previously given by the DSP 34, to the outer product (=Tx$_{offset[n+1]}$), as expressed by the aforementioned Equation (2), of the offset compensation vector CMP$_{[n]}$ and the offset compensation vector CMP$_{[n-1]}$, and holds that offset vector Tx$_{offset[n]}$.

Moreover, the offset compensator 51B adds that offset vector Tx$_{offset[n+1]}$ to the two "modulated signals" indicating the aforementioned sending data and intersecting at right angles, and hands over the sum to the D/A converter 52.

On the other hand, the timer 35 generates either of the following clock signals:

a clock signal rising or falling with the period for the aforementioned offset vector Tx$_{offset[n]}$ to be updated; and a clock signal rising or falling at an instant prior to the instant when the offset vector Tx$_{offset[n]}$ is to be updated, for the time period required by the DSP 34 for the operations to update the offset vector Tx$_{offset[n]}$.

The DSP 34 starts the processing to update the offset vector Tx$_{offset[n]}$ at the rising or falling instant of the aforementioned clock signal, and shifts to either of the following modes after the end of the processing:

a standby mode for standby without any processing; and a power-saving mode, in which no electric power is consumed or in which the necessary minimum power only for reopening the aforementioned processing quickly is consumed.

In short, the DSP 34 stands by without any useless processing for the time period, in which the processing to update the offset vector Tx$_{offset[n]}$ need not be performed.

According to this embodiment, therefore, the power can be drastically saved, as compared with the case, in which the DSP 34 continues any operation steadily, thereby to release restrictions drastically not only on the thermal design but also on the high-density assembly and the synthetic low cost/size.

Here in this embodiment, the quadrature demodulator 14, the integrator 15, the subtracter 17 and the adaptive control unit 18 (18A to 18D) are configured as the firmware to be executed by the single DSP (Digital Signal Processor) 34.

However, the invention should not be limited to such configuration, but the hardware and/or the software may have any configuration so long as all or some of the aforementioned operations are performed in response to the rise or fall of the aforementioned clock signals.

Ninth Embodiment

Figure 10:
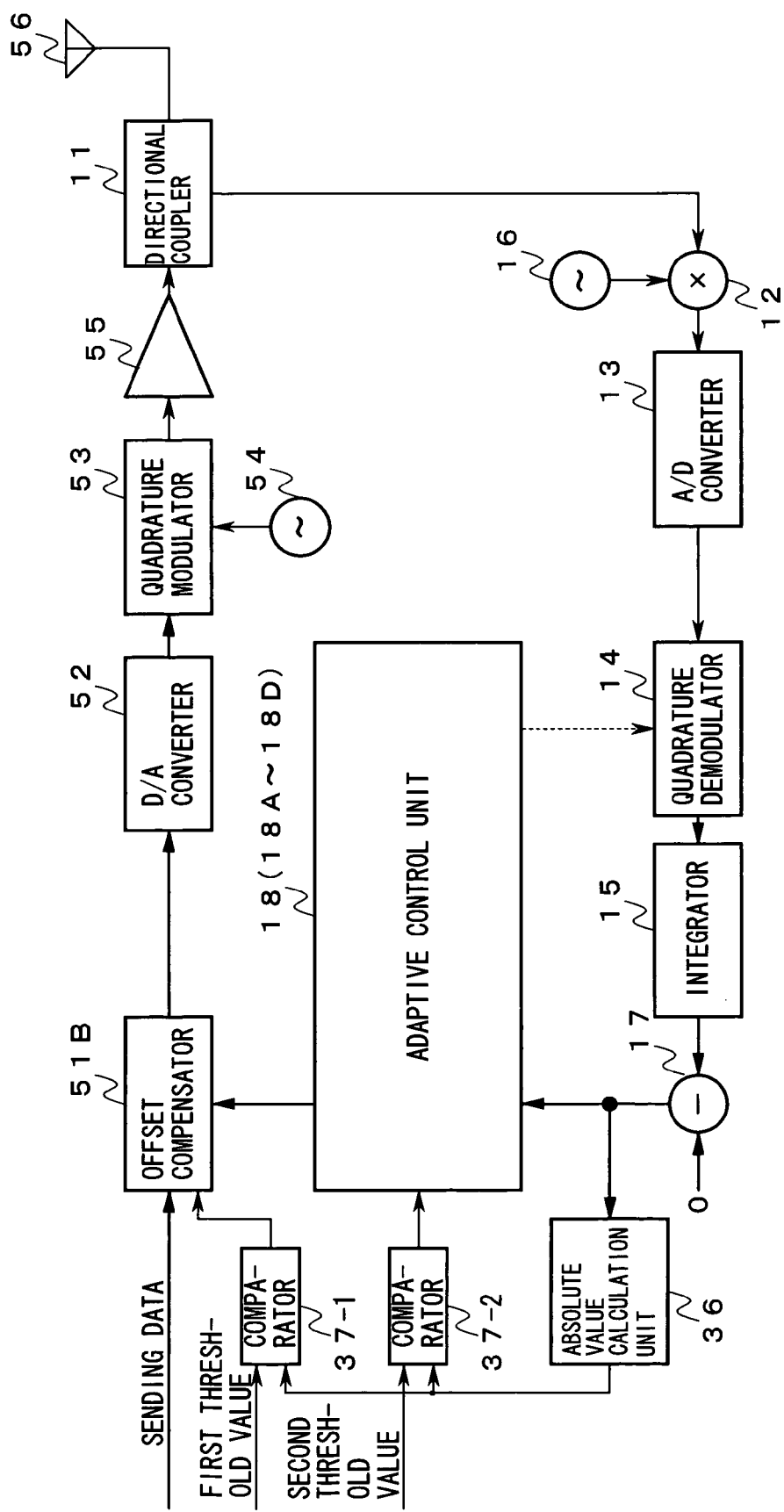
FIG. 10 is a block diagram showing a ninth embodiment of the present invention.

FIG. 10 is a block diagram showing the ninth embodiment of the present invention.

This embodiment is provided with the following components:

an absolute value calculation unit 36 having its input connected with the output of the subtracter 17;

a comparator 37-1 having its one input connected with the output of the absolute value calculation unit 36 and its other input fed with a first threshold value, and having its output connected with the control input of the offset compensator 51B; and a comparator 37-2 having its one input connected with the output of the absolute value calculation unit 36 and its other input fed with a second threshold value, and having its output connected with the control input of the adaptive control unit 18 (18A to 18D).

The actions of the ninth embodiment of the invention are described with reference to FIG. 10.

The absolute value calculation unit 36 determines the absolute value ($=|Rx_{offset[n]}|$) of the deviation $Rx_{offset[n]}$ determined by the subtracter 17.

The comparator 37-2 discriminates whether or not that absolute value is at the aforementioned second threshold value or more. Only for the period of the YES of the result of the discrimination, the adaptive control unit 18 (18A to 18D) acts to update the aforementioned offset compensation vector $CMP_{[n]}$.

On the other hand, the comparator 37-1 discriminates whether or not the aforementioned absolute value is the aforementioned first threshold value (as assumed for simplicity to be larger than the second threshold value) or more. Only for the period of the YES of the result of the discrimination, the offset compensator 51B performs the following processing:

the offset compensator 51B updates the offset vector $Tx_{offset[n]}$, which is set on the basis of the offset compensation vector $CMP_{[n]}$ preceding the offset compensation vector $CMP_{[n]}$ previously given by the adaptive control unit 18 (18A to 18D), to the outer product ($=Tx_{offset[n+1]}$), as expressed by the aforementioned Equation (2), of the offset compensation vector $CMP_{[N]}$ and the offset compensation vector $CMP_{[n-1]}$, and holds that offset vector $Tx_{offset[n]}$; and the offset compensator 51B adds that offset vector $Tx_{offset[n+1]}$ to the two "modulated signals" indicating the aforementioned sending data and intersecting at right angles, and hands over the sum to the D/A converter 52.

Specifically, the adaptive control unit 18 (18A to 18D) acts only for the period, in which the absolute value of the deviation $Rx_{offset[n]}$ determined by the subtracter 17 exceeds the aforementioned threshold value.

As compared with the case, in which the adaptive control unit 18 (18A to 18D) acts steadily or intermittently in the frequency for the offset vector $Tx_{offset[n]}$ to be simply updated, therefore, the useless power consumption is more avoided in the state where the offset level $Tx_{offset[n]}$ has converged into a proper value in a desired accuracy (as set at the second threshold value).

Here, this embodiment is provided with the comparator 37-1 in addition to the comparator 37-2, and the first threshold value to be fed to the comparator 37-1 is set to a value larger than the aforementioned second threshold value.

However, the invention should not be limited to this configuration, but may also be configured such that the comparator 37-1 is contained in the comparator 37-2 or such that the comparator 37-1 is dispensed with, so long as the offset vector $Tx_{offset[n]}$ is reliably updated on the basis of the offset compensation vector $CMP_{[n]}$ updated by the adaptive control unit 18 (18A to 18D).

In the embodiment, moreover, the period for the adaptive control unit 18 (18A to 18D) to act is specified by the comparator 37-2 on the basis of the absolute value of the aforementioned deviation $Rx_{offset[n]}$.

Figure 11:
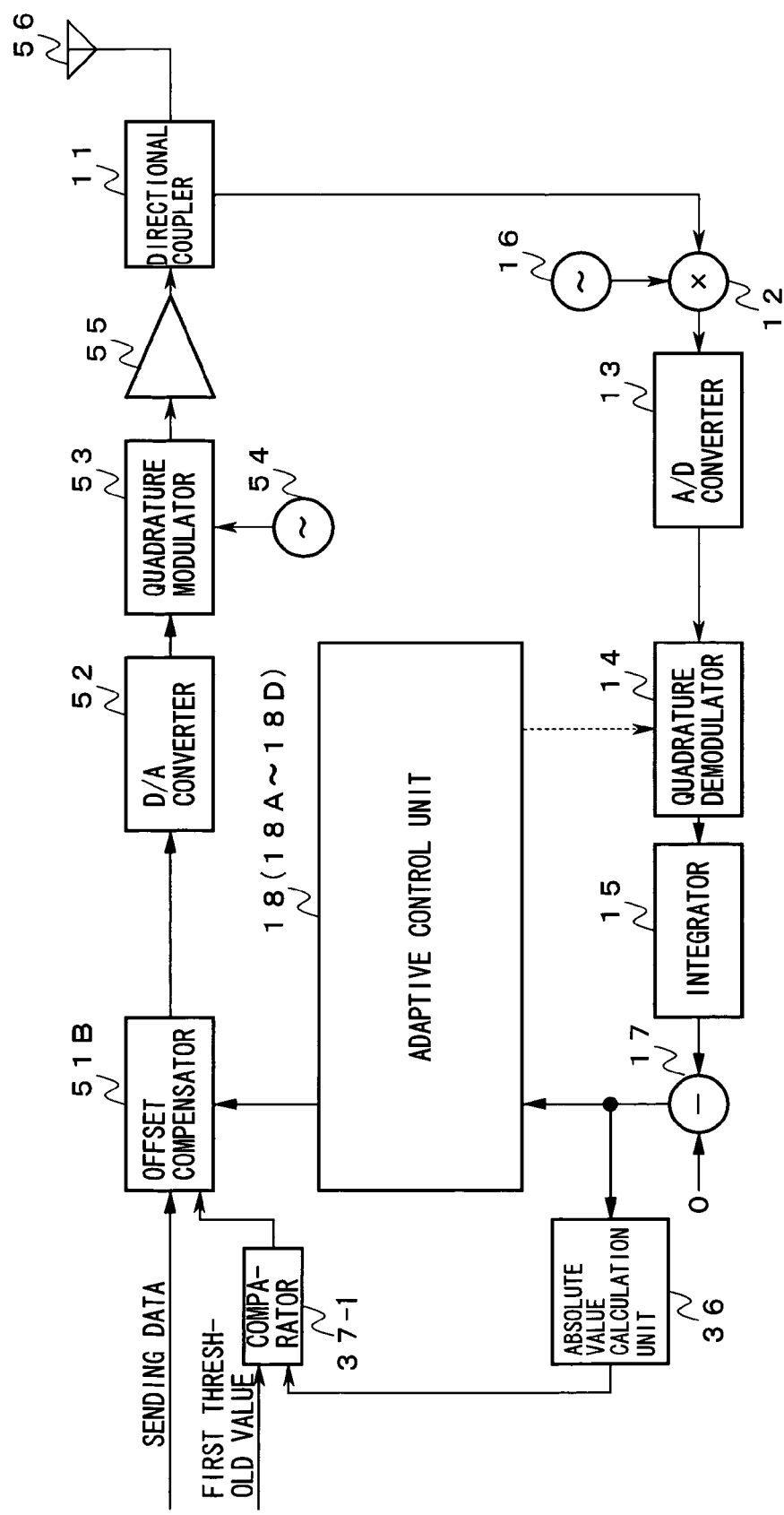
FIG. 11 is a block diagram showing another configuration of the ninth embodiment of the present invention.

In case, however, a useless power consumption is permitted in the adaptive control unit 18 (18A to 18D), the comparator 37-2 may be dispensed with, for example, as shown in FIG. 11.

In the aforementioned individual sixth, seventh and ninth embodiments, moreover, the aforementioned step size variable unit 32, integration control unit 33 and absolute value calculation unit 36 are given the deviation $Rx_{offset[n]}$ determined by the subtracter 17.

However, these step size variable unit 32, integration control unit 33 and absolute value calculation unit 36 may also be given the increment $\delta_{[n]}$ determined by the subtracter 20, in place of the deviation $Rx_{offset[n]}$.

Tenth Embodiment

Figure 12:
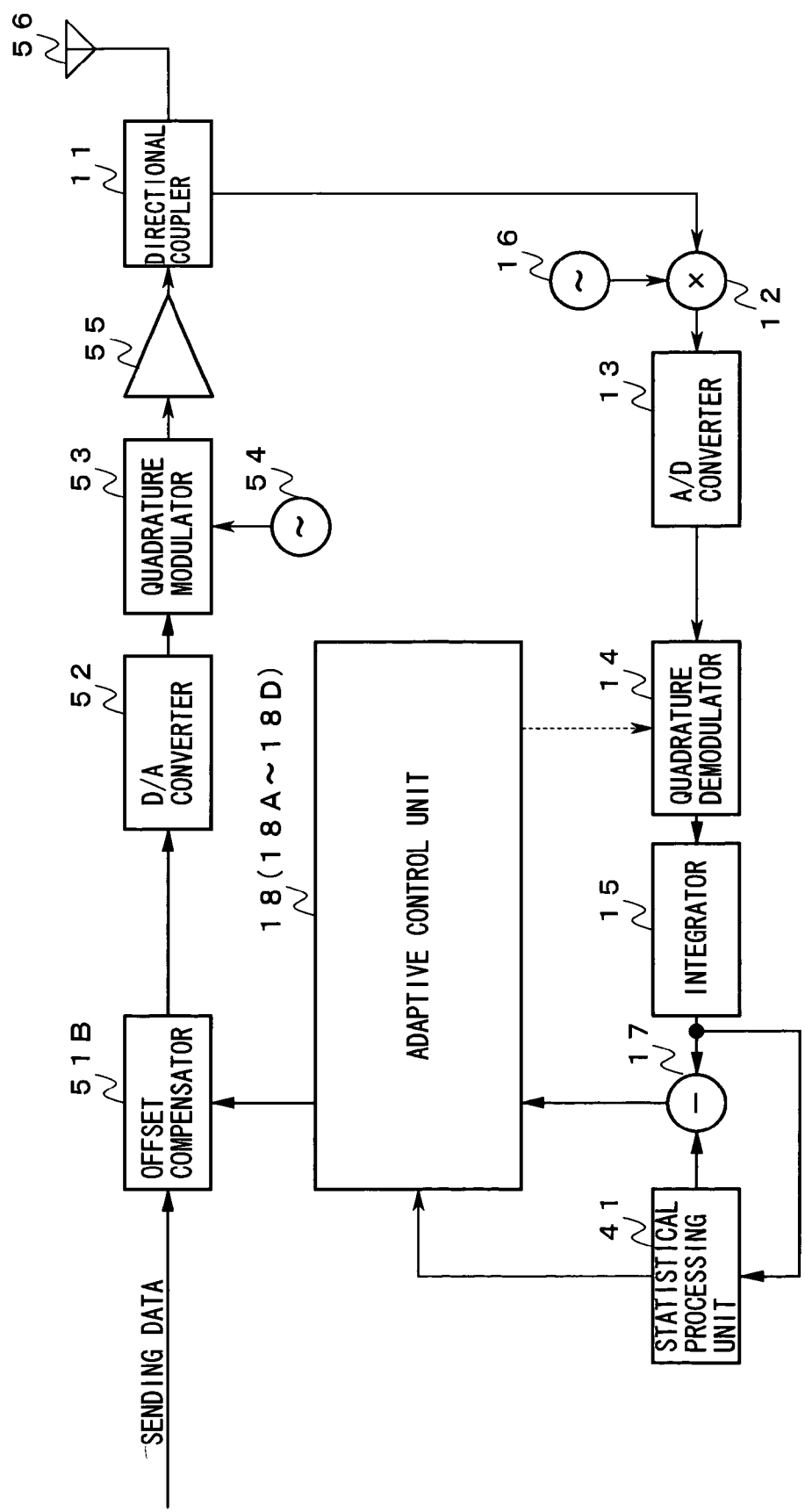
FIG. 12 is a block diagram showing a tenth embodiment of the present invention.

FIG. 12 is a block diagram showing the tenth embodiment of the present invention.

This embodiment is provided with a statistical processing unit 41 having its input connected with the output of the integrator 15 and its first and second outputs connected with the control input of the adaptive control unit 18 (18A to 18D) and the other input of the subtracter 17, respectively.

The actions of the tenth embodiment of the invention are described with reference to FIG. 12.

The statistical processing unit 41 performs the following operations:

the statistical processing unit 41 calculates the average value and the dispersion of the offset components, which are determined by the integrator 15 and individually contained in the aforementioned monitored signals i and q (I and Q), in parallel; and the statistical processing unit 41 discriminates whether or not the dispersion exceeds a predetermined threshold value.

The subtracter 17 applies the average value thus calculated, as the target value of the aforementioned deviation $Rx_{offset[n]}$.

On the other hand, the adaptive control unit 18 (18A to 18D) acts only for the period of the YES of the result of the discrimination.

Specifically, the adaptive control unit 18 (18A to 18D) acts not only while the aforementioned average value of the offsets exceeds the predetermined lower limit but also while the offsets increase/decrease within a predetermined range.

After the offset vector $Tx_{offset[n]}$ accurately converged into a proper value, therefore, the power consumption due to the useless action of the adaptive control unit 18 (18A to 18D) can be highly avoided unless the factor (due to the environmental condition, the aging change or the like) for the offset vector $Tx_{offset[n]}$ to be drastically updated occurs.

Eleventh Embodiment

Figure 13:
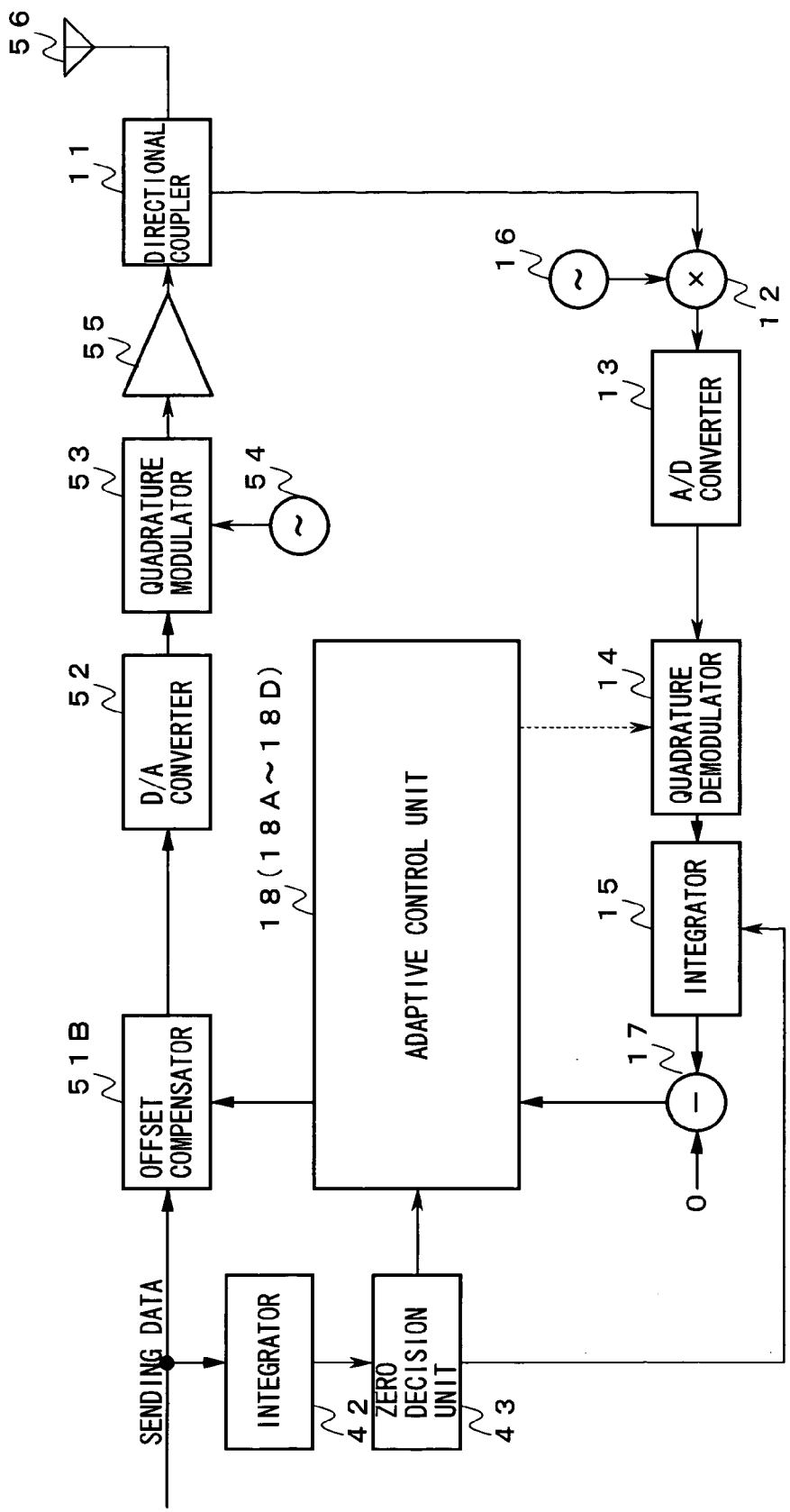
FIG. 13 is a block diagram showing an eleventh embodiment of the present invention.

FIG. 13 is a block diagram showing the eleventh embodiment of the present invention.

This embodiment is configured to include the following components:

an integrator 42 given the aforementioned sending data; and a zero decision unit 43 having its input connected with the output of the integrator 42 and its first output and second output connected with the control terminal of the adaptive control unit 18 (18A to 18D) and the control terminal of the integrator 15.

The actions of the eleventh embodiment of the invention are described with reference to FIG. 13.

The integrator 42 determines the average value of the DC components superposed on the sending data, by smoothing the sending data in the order of the time series.

The zero decision unit 43 informs the integrator 15 and the adaptive control unit 18 (18A to 18D) of the instant (which may also be delayed over the total of the time periods necessary for the transmissions of the forward line and the feedback line) of each time when the average value becomes "0".

At this instant, the integrator 15 newly starts the processing to smooth the aforementioned quadrature-monitored signals i and q (I and Q) individually, thereby to determine the offset components contained in those quadrature-monitored signals i and q (I and Q).

These offset components do not contain the DC components superposed prior to the sending data, because they are determined by smoothing the quadrature-monitored signals i and q (I and Q) when and after it is detected that the average value of the DC components superposed on the sending data is "0".

Moreover, the adaptive control unit 18 (18A to 18D) starts a new run each time the aforementioned instant is informed by the zero decision unit 43, and makes the aforementioned adaptive control with reference to the deviation $Rx_{offset[n]}$ which is determined by the subtracter 17 in accordance with the offset components, in which the DC components determined by the integrator 15 and superposed prior to the sending data are not contained.

According to this embodiment, therefore, the compensation of the offset, as caused in the forward line, is accurately achieved, as compared with the case, in which the integrator 15 and the adaptive control unit 18 (18A to 18D) run irrespective of the "average value of the DC components superposed on the sending data".

Twelfth Embodiment

Figure 14:
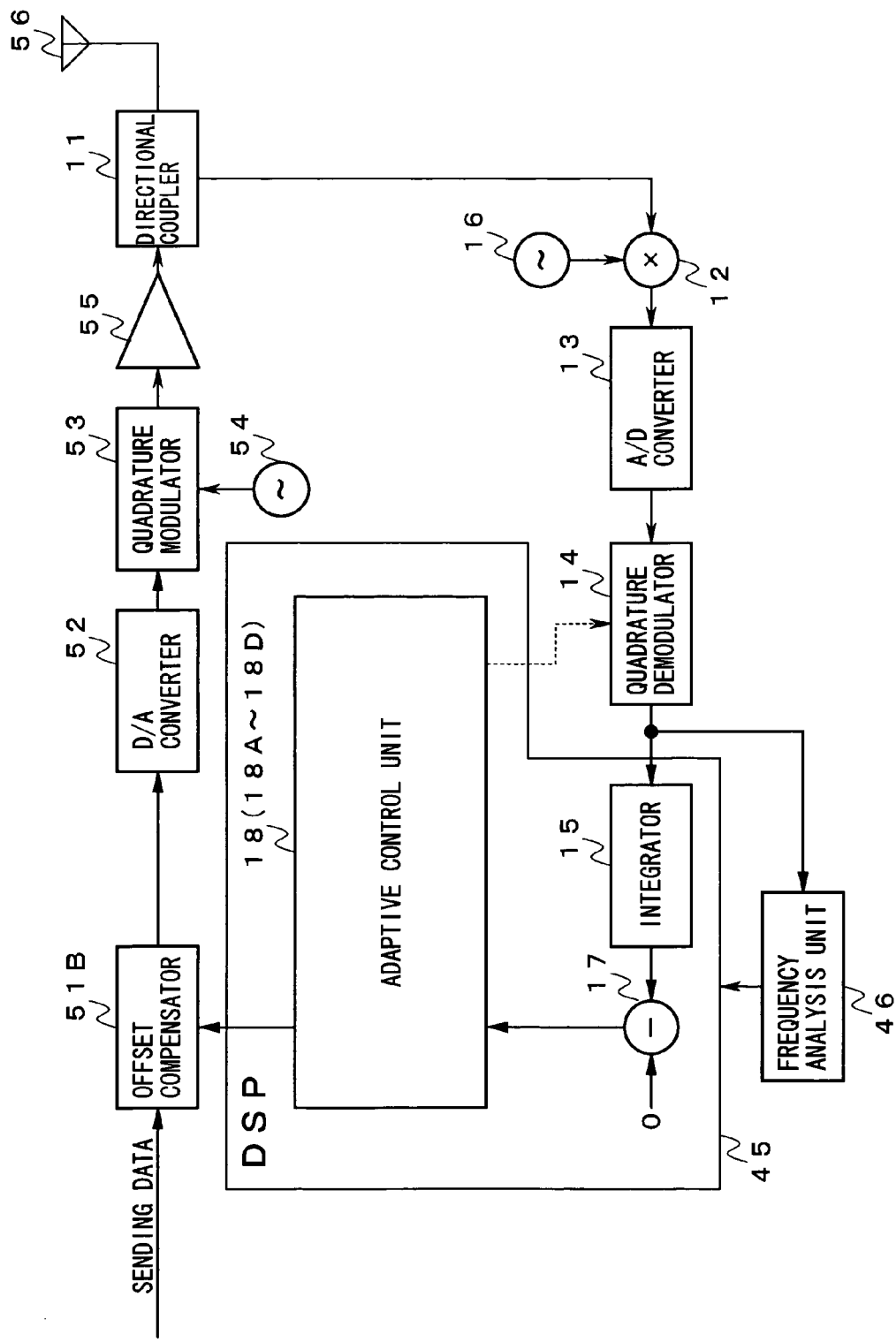
FIG. 14 is a block diagram showing a twelfth embodiment of the present invention.

FIG. 14 is a block diagram showing the twelfth embodiment of the present invention.

This embodiment is configured, as follows:

the integrator 15, the subtracter 17 and the adaptive control unit 18 (18A to 18D) are configured as a firmware to be executed by a single DSP 45; and the embodiment is provided with a frequency analysis unit 46 having its input connected with the output of the quadrature demodulator 14 and its output connected with the control terminal of the DSP 45.

The actions of the twelfth embodiment of the invention are described with reference to FIG. 14.

The frequency analysis unit 46 performs the following processings:

the frequency analysis unit 46 subjects the quadrature-monitored signals i and q (I and Q) determined by the quadrature demodulator 14, to Fast Fourier Transform (FFT) thereby to extract the DC components contained in those quadrature-monitored signals i and q (I and Q) and the components of the desired band adjoining the DC components on the frequency axis; and the frequency analysis unit 46 decides whether or not the level of the components exceeds a predetermined upper limit, and gives the decision result to the DSP 45.

The DSP 45 acts only for the period of the YES of the result of the discrimination.

In the state where the offset vector $Tx_{offset[n]}$ has converged into a proper value under the aforementioned proper control, the trial of the useless adaptive control is regulated, so long as it is discriminated on the basis of the level of not only the aforementioned DC components but also the level of the components distributing in the desired band containing those DC components.

According to this embodiment, therefore, a flexible adaptation can be made on the various modulation schemes to be done by the quadrature modulator 53 and the constellation.

In this embodiment, the components of the desired ban contained in the quadrature-monitored signals i and q (I and Q) are extracted on the basis of the Fast Fourier Transform.

However, these components may also be extracted through a desired low-pass filter or band-pass filter, for example.

In the aforementioned individual embodiments, on the other hand, the D/A conversions individually corresponding to the aforementioned two channels I and Q are made at the upstream stage of the quadrature modulator 53.

However, the invention is not limited to such configuration but may also dispense with the D/A converter 52, for example, in case both the sending data to be transmitted through those channels are fed as analog signals.

In the aforementioned individual embodiments, moreover, the sending data to be individually transmitted through the aforementioned two channels I and Q are individually given in parallel.

However, the invention is not limited to such configuration. Even in case the modulated signal indicating the sending data is given as a single analog signal or digital signal, however, the invention can also be likewise applied to any device, so long as the quadrature modulator is provided for outputting a modulated-wave signal as the sum of products of two carrier signals intersecting at right angles and their modulated signals and for causing the offset.

In the aforementioned individual embodiments, on the other hand, the power amplifier 55 arranged at the downstream stage of the quadrature modulator 53 is included in the forward line, and the mixer 12 arranged at the upstream stage of the A/D converter 13 is included in the feedback line.

However, the invention should not be limited to such configuration. For example, the invention can also be configured such that it is not provided with the directional coupler 11, the mixer 12 and the oscillator 16, and such that the input of the A/D converter 13 is coarsely coupled to the output of the quadrature modulator 53.

Thirteen Embodiment

Figure 15:
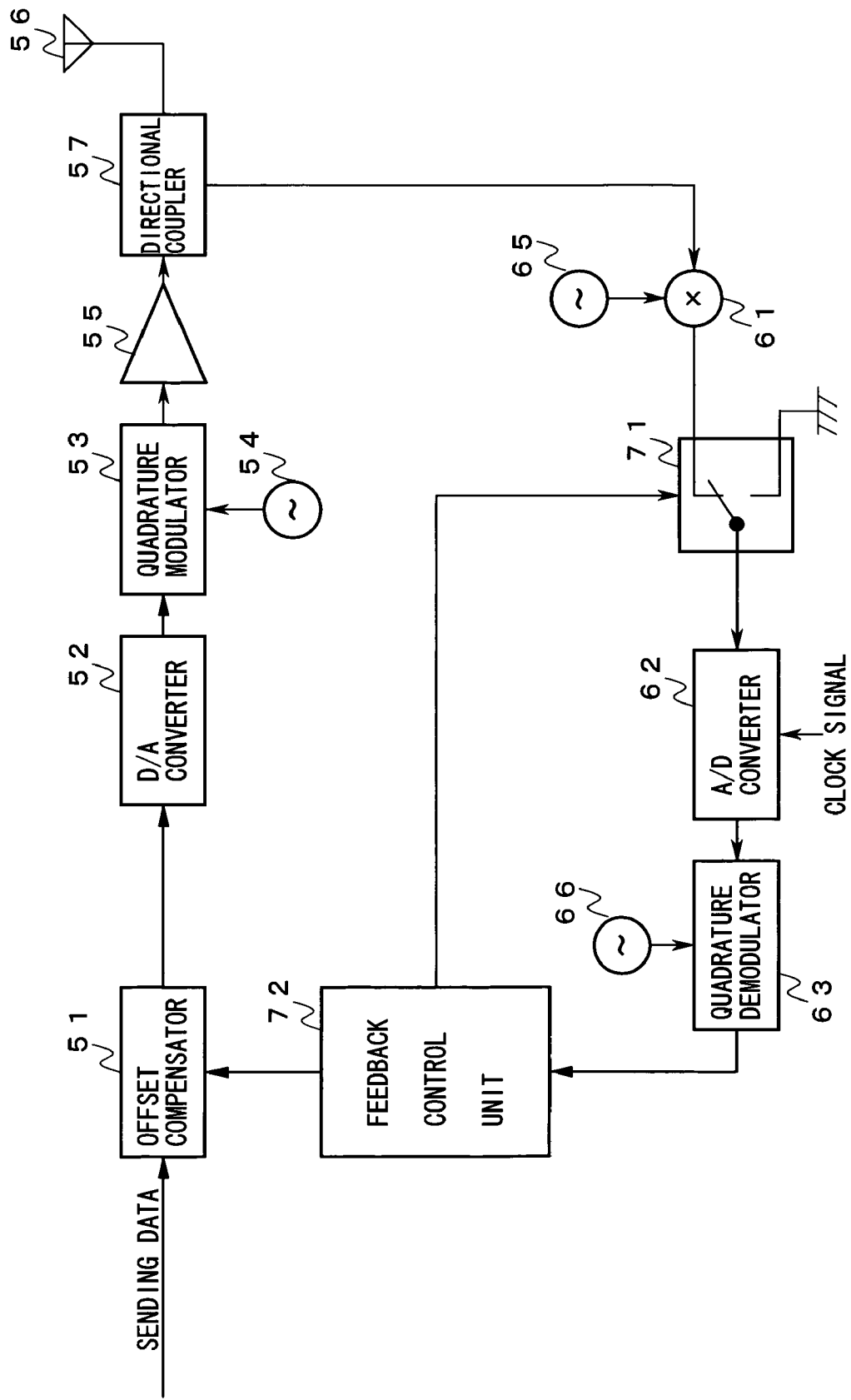
FIG. 15 is a block diagram showing a thirteenth embodiment of the present invention.

FIG. 15 is a block diagram showing a thirteenth embodiment of the invention.

The configuration of this embodiment is different from that of the prior art example shown in FIG. 22, in the following points:

the output of a mixer 61 is connected with one contact with a switch 71 in place of the input of an A/D converter 62;

the other contact of the switch 71 is grounded to the earth, and the common contact of the switch 71 is connected with the input of the A/D converter 62; and the embodiment is provided, in place of a feedback control unit 64, with a feedback control unit 72, the specific output portion of which is connected with the control terminal of the switch 71.

Figure 16:
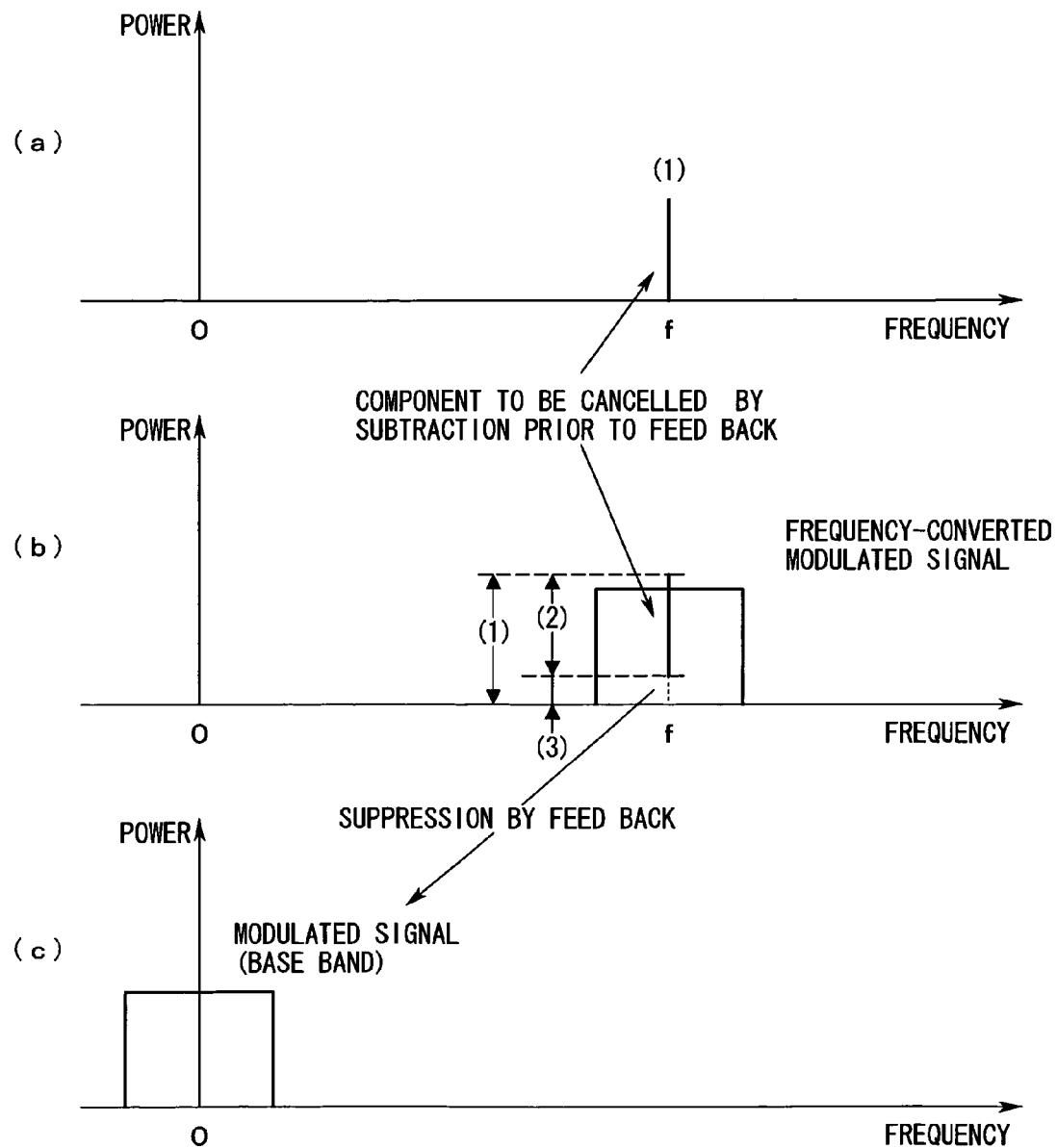
FIG. 16 presents diagrams explaining the actions of the thirteenth embodiment of the present invention.

FIG. 16 presents diagrams explaining the actions of the thirteenth embodiment of the invention.

The actions of the thirteenth embodiment of the invention are described with reference to FIG. 15 and FIG. 16.

This embodiment is characterized in the following processing procedures to be performed by the feedback control unit 72 in association with the switch 71.

The feedback control unit 72 is so timed by the starting time and a predetermined period (far shorter than the shortest interval, at which the level of the components of the clock signal obtained at the output of the A/D converter 62 can change, for example) as to connect the common contact of the switch 71 with the other contact of the switch 71 for a specified period, thereby to terminate the input of the A/D converter 62 and to block the feed of the monitored intermediate-frequency signal to the input of the A/D converter 62. Here, it is assumed that the timing is given only for the period, in which the aforementioned modulated-wave signal is not sent through the antenna 56.

Therefore, the digital signal, which is obtained at the output of the A/D converter 62 for this period, contains not the components of the aforementioned monitored intermediate-frequency signal but mainly the components of the clock signal which has been transmitted from the inside to the output terminal of the A/D converter 62, as has been described hereinbefore.

For that period, moreover, a quadrature demodulator 63 quadrature-demodulates the digital signal thereby to generate the signal (as will be called the "attendant quadrature-monitored signal") i0, q0 indicating the components of the aforementioned clock signal.

The feedback control unit 72 smoothes the attendant quadrature-monitored signals i0 and q0 on a complex plane thereby to determine the offset components (as will be called the "attendant offset components") contained in those attendant quadrature-monitored signals i0 and q0 (as shown at (1) in (a) of FIG. 16).

While the aforementioned demodulated signal is being sent through the antenna, 56 moreover, the feedback control unit 72 is connected at its one contact with the common contact of the switch 71.

Therefore, the monitored intermediate-frequency signal generated by the mixer 61 is fed to the A/D converter 62. Like the example of the prior art, the A/D converter 62 converts the monitored intermediate-frequency signal into the digital signal, and the quadrature demodulator 66 quadrature-demodulates the digital signal thereby to generate the quadrature-monitored signals i and q.

Moreover, the feedback control unit 72 smoothes the quadrature-monitored signals i and q on the complex plane thereby to determine the offset components (as shown at (1) in (b) of FIG. 16) contained in those quadrature-monitored signals i and q, and to feed back the difference (as shown at (3) in (b) of FIG. 16) between the offset components and the aforementioned attendant offset components (as shown at (1) in (a) and at (2) in (b) of FIG. 16), to the offset compensator 51.

In short, the difference thus fed back has no superposition of the clock components transmitted from the inside to the output of the A/D converter 62.

According to this embodiment, therefore, the offset of the section from the output terminal of the offset compensator 51 to the input terminal of the quadrature modulator 53 through the D/A converter 52 can be compensated stably and accurately, as shown at (c) in FIG. 16, even in case the level of the clock components transmitted from the inside to the output of the A/D converter 62 is high and can widely change.

Fourteenth Embodiment

Figure 17:
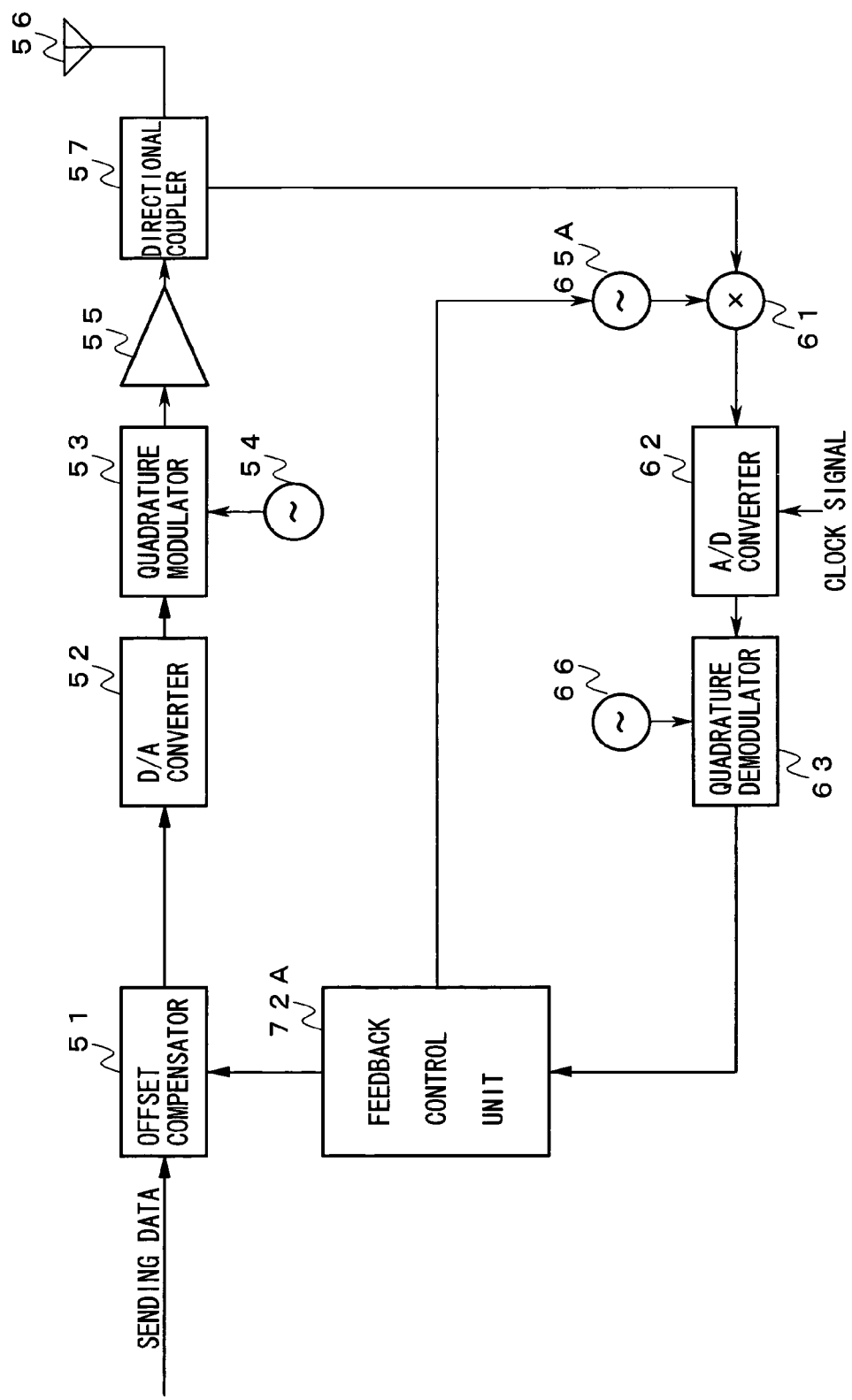
FIG. 17 is a block diagram showing a fourteenth embodiment of the present invention.

FIG. 17 is a block diagram showing the fourteenth embodiment of the present invention.

The configuration of this embodiment is different from that of the prior art shown in FIG. 22, in the following points:

the configuration is provided with an oscillator 65A in place of the oscillator 65; and the feedback control unit 64 is replaced by a feedback control unit 72A having its output port connected with the control terminal of the oscillator 65A.

Figure 18:
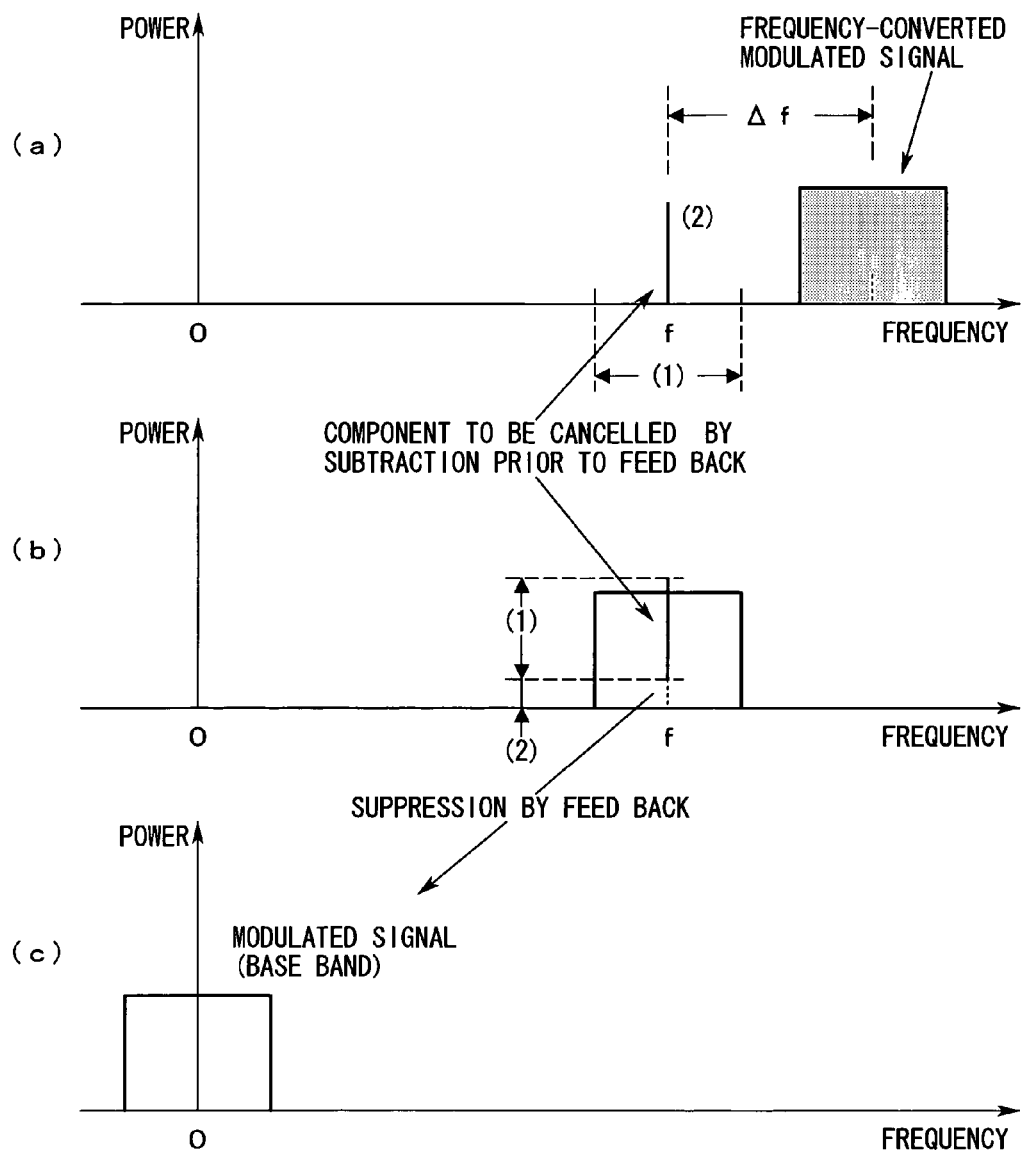
FIG. 18 presents diagrams explaining the actions of the fourteenth embodiment of the present invention.

FIG. 18 presents diagrams for explaining the actions of the fourteenth embodiment of the invention.

The actions of the fourteenth embodiment of the invention are described with reference to FIG. 17 and FIG. 18.

This embodiment is characterized in the following processing procedures to be performed by the feedback control unit 72A in association with the oscillator 65A.

The feedback control unit 72A is so timed by the starting time and a predetermined period (shorter than the shortest interval, at which the level of the components of the clock signal obtained at the output of the A/D converter 62 can change, for example) as to shift the oscillation frequency of the oscillator 65A for a specified period, thereby to set the frequency of the local-frequency signal given to the mixer 61, lower by $\Delta f$. Here, this value $\Delta f$ is preset to such values as are lower by (fmax−fc) or more or (fmin−fc) or less than the frequencies fmax and fmin of the lower end and the upper end of the occupied band of the modulated signal given to the mixer 61 through a directional coupler 57, and the frequency fc (e.g., (fmax+fmin)/2, although different according to the modulation scheme applied) of the carrier signal fed for generating the modulated signal.

For this period, therefore, the occupied band of the monitored intermediate-frequency signal, which is generated by the mixer 61 and given to the A/D converter 62, so distributes around a higher frequency (=f+$\Delta f$) than the aforementioned frequency fc, for example, as is screened at (a) in FIG. 18.

In the digital signal obtained for the aforementioned period at the output of the A/D converter 62, more specifically, the components of the monitored intermediate-frequency signal are not distributed in the band (at (1) in (a) of FIG. 18), in which the components of the monitored intermediate-frequency signal should be distributed, so that the components of the clock signal transmitted from the inside to the output terminal of the A/D converter 62, as has been described hereinbefore, are contained as the "components (at (2) in (a) of FIG. 18) having a frequency equal to f".

Moreover, the quadrature demodulator 63 quadrature-demodulates the digital signal thereby to generate the attendant quadrature-monitored signals i0 and q0 indicating the components of the aforementioned clock signal, as in the aforementioned thirteen embodiment.

The feedback control unit 72A smoothes the attendant quadrature-monitored signals i0 and q0 on the complex plane thereby to determine the attendant offset components (at (2) in (a) of FIG. 18) contained in those attendant quadrature-monitored signals i0 and q0.

While the aforementioned modulated signal is being sent through the antenna 56, the feedback control unit 72A sets the frequency of the local-frequency signal given to the mixer 61, to the intrinsic value.

The monitored intermediate-frequency signal generated by the mixer 61 is fed to the A/D converter 62, and the A/D converter 62 converts the monitored intermediate-frequency signal as in the example of the prior art into the digital signal. The quadrature demodulator 63 quadrature-demodulates the digital signal thereby to generate the quadrature-monitored signals i and q.

Moreover, the feedback control unit 72A smoothes the quadrature-monitored signals i and q on the complex plane thereby to determine the offset components (as shown at (1) in (b) of FIG. 18) contained in those quadrature-monitored signals i and q, and to feed back the difference between the offset components and the aforementioned attendant offset components (as shown at (1) in (a) and at (2) in (b) of FIG. 18), to the offset compensator 51.

In short, the difference thus fed back has no superposition of the clock components transmitted from the inside to the output of the A/D converter 62.

According to this embodiment, therefore, the offset of the section from the output terminal of the offset compensator 51 to the input terminal of the quadrature modulator 53 through the D/A converter 52 can be compensated stably and accurately, as shown at (c) in FIG. 18, even in case the level of the clock components transmitted from the inside to the output of the A/D converter 62 is high and can widely change.

Fifteenth Embodiment

Figure 19:
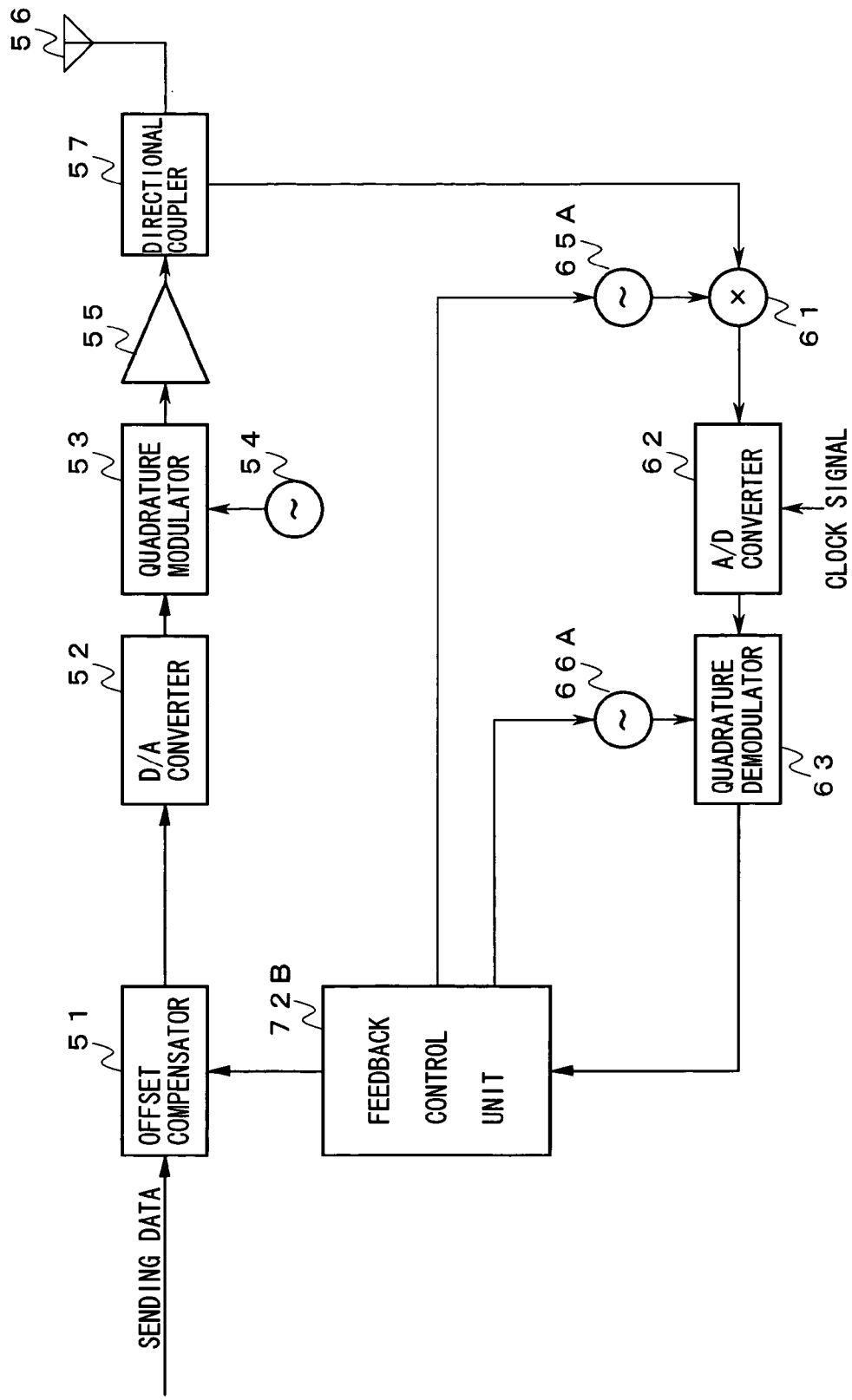
FIG. 19 is a block diagram showing fifteenth to seventeenth embodiments of the present invention.

FIG. 19 is a block diagram showing the fifteenth to seventeenth embodiments of the present invention.

The configuration of these embodiments is different from that of the fourteenth embodiment shown in FIG. 17, in the following points:

the configuration is provided with an oscillator 66A in place of the oscillator 66; and the configuration is provided, in place of the feedback control unit 72A, with a feedback control unit 72B, which has an output port connected with the control input of the oscillator 66A.

Figure 20:
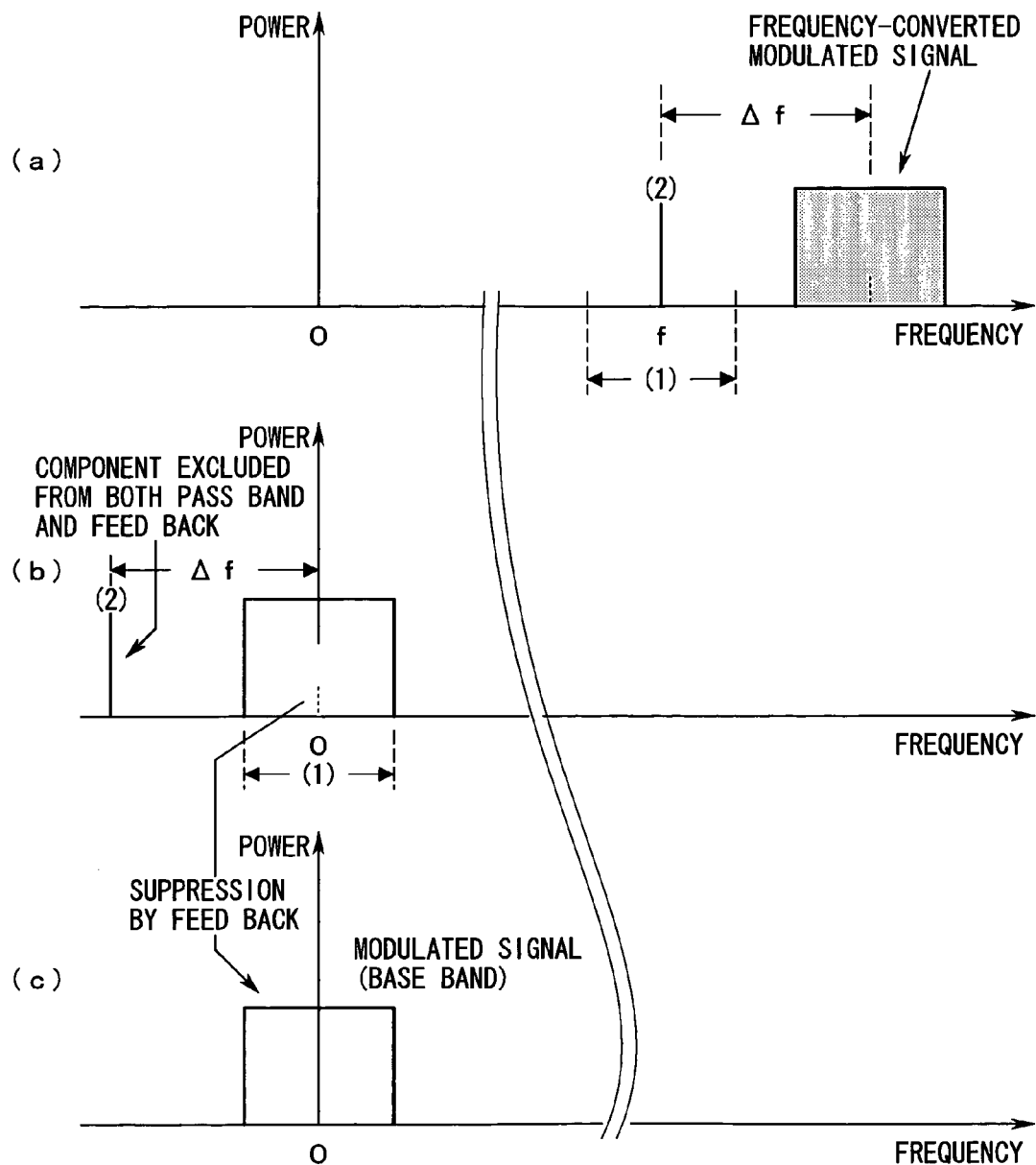
FIG. 20 presents diagrams explaining the actions of the fifteenth embodiment of the present invention.

FIG. 20 presents diagrams for explaining the actions of the fifteenth embodiment of the invention.

The actions of the fifteenth embodiment of the invention are described with reference to FIG. 19 and FIG. 20.

This embodiment is characterized in the following processing procedures to be performed by the feedback control unit 72B in association with the oscillators 65A and 66A.

The feedback control unit 72B shifts the oscillation frequency of the oscillator 65A and the oscillation frequency of the oscillator 66A in the opposite directions thereby to set the frequency of the local-frequency signal given to the mixer 61, lower by $\Delta f$ and the frequencies of the two carrier signals given to the quadrature demodulator 63, higher by $\Delta f$. Here is omitted the explanation of the value of $\Delta f$, because the value is similar to that of the aforementioned fourteenth embodiment.

Therefore, the occupied band of the monitored intermediate-frequency signal, which is generated by the mixer 61 and given to the A/D converter 62, so distributes around a frequency ($=f+\Delta f$) higher over $\Delta f$ than the aforementioned frequency f, for example, as is screened at (a) in FIG. 20.

In the digital signal obtained at the output of the A/D converter 62, on the other hand, the components of the monitored intermediate-frequency signal are not distributed in the band (at (1) in (a) of FIG. 20), in which the components of the monitored intermediate-frequency signal should be distribute, so that the components of the clock signal transmitted from the inside to the output terminal of the A/D converter 62, as has been described hereinbefore, are contained as the "components (at (2) in (a) of FIG. 20) having a frequency equal to f".

Moreover, the quadrature demodulator 63 quadrature-demodulates the aforementioned digital signal on the basis of the two carrier signals, which are generated by the oscillator 66A and have a frequency set higher by $\Delta f$.

In the course of this quadrature demodulation, both the components of the monitored intermediate-frequency signal and the components of the aforementioned clock signal are shifted to a lower band on the frequency axis over $\Delta f$.

Therefore, the major components of the quadrature-monitored signals i and q generated by the quadrature demodulator 63 are distributed in the intrinsic band in the base band area (at (1) in (b) FIG. 20), but the components of the aforementioned clock signal are distributed outside of that band (at (2) in (b) of FIG. 20).

The feedback control unit 72B smoothes those quadrature-monitored signals i and q on the complex plane thereby to determine the offset components contained in those quadrature-monitored signals i and q, and feeds back the offset components to the offset compensator 51 thereby to compensate the offset, as might otherwise be caused by the imbalance between the aforementioned I-channel and Q-channel, over the section from the output terminal of the offset compensator 51 through the D/A converter 52 to the input terminal of the quadrature modulator 53.

In short, the clock components transmitted from the inside to the output of the A/D converter 62 are not superposed on the different thus fed back.

According to this embodiment, therefore, the offset of the section from the output terminal of the offset compensator 51 to the input terminal of the quadrature modulator 53 through the D/A converter 52 can be compensated stably and accurately, as shown at (c) in FIG. 20, even in case the level of the clock components transmitted from the inside to the output of the A/D converter 62 is high and can widely change.

Sixteenth Embodiment

The actions of the sixteen embodiment of the present invention are described with reference to FIG. 19.

This embodiment is characterized by the following processing procedures to be performed by the feedback control unit 72B.

The feedback control unit 72B performs operations similar to those of the fifteenth embodiment only for the aforementioned period, and holds the "offset components contained in the quadrature-monitored signals i and q" determined in the course of the operations.

After the aforementioned period elapsed, moreover, the feedback control unit 72B releases the changes in the oscillation frequency of the oscillator 65A and the oscillation frequency of the oscillator 66A thereby to set both the frequency of the local-frequency signal given to the mixer 61 and the frequencies of the two carrier signals given to the quadrature demodulator 63, to intrinsic values.

Moreover, the period control unit 72B does not determine the offset components again by smoothing the quadrature-monitored signals i and q given in the association of the mixer 61, the A/D converter 62 and the quadrature demodulator 63, on the complex plane, but feeds back the aforementioned held offset components subsequent to the offset compensator 51 thereby to compensate the offset, which is caused due to the imbalance between the aforementioned I-channel and Q-channel, over the section from the output terminal of the offset compensator 51 through the D/A converter 52 to the input terminal of the quadrature modulator 53.

In short, the difference thus fed back does not obtain the clock components transmitted from the inside to the output of the A/D converter 62.

According to this embodiment, as in the aforementioned thirteenth to fifteenth embodiments, therefore, the offset of the section from the output terminal of the offset compensator 51 to the input terminal of the quadrature modulator 53 through the D/A converter 52 can be compensated stably and accurately, even in case the level of the clock components transmitted from the inside to the output of the A/D converter 62 is high and can widely change.

According to this embodiment, moreover, the offset compensation is made in high accuracy even after the aforementioned held components are required. After the offset components were determined, both the frequency of the local-frequency signal given to the mixer 61 and the frequencies of the two carrier signals given to the quadrature demodulator 63 are set to the intrinsic values, so that the strain compensation to be made on the premise of those frequencies is achieved accurately over a wide band.

Seventeenth Embodiment

The actions of the seventeenth embodiment of the present invention are described with reference to FIG. 19.

This embodiment is characterized by the following processing procedures to be performed by the feedback control unit 72B.

The feedback control unit 72B performs procedures similar to those of the fifteenth embodiment only for the aforementioned period, and holds the "offset components contained in the quadrature-monitored signals i and q" determined in the course of those procedures.

Moreover, the feedback control unit 72B performs the following operations after lapse of such period:

the feedback control unit 72B releases the changes in the oscillation frequency of the oscillator 65A and the oscillation frequency of the oscillator 66A thereby to set both the frequency of the local-frequency signal given to the mixer 61 and the frequencies of the two carrier signals given to the quadrature demodulator 63, to intrinsic values;

the feedback control unit 72B feeds back the aforementioned held offset components subsequent to the offset compensator 51 thereby to compensate the offset, which is caused due to the imbalance between the aforementioned I-channel and Q-channel, over the section from the output terminal of the offset compensator 51 through the D/A converter 52 to the input terminal of the quadrature modulator 53; and the feedback control unit 72B smoothes, in parallel with that compensation, the quadrature-monitored signals i and q given by the association among the mixer 61, the A/D converter 62 and the quadrature demodulator 63, thereby to determine the aforementioned attendant offset components sequentially, and holds the attendant offset components.

After the attendant offset components were thus held, moreover, the feedback control unit 72B repeats the following operations without returning the aforementioned Δf again to "0":

the feedback control unit 72B smoothes the quadrature-monitored signals i and q generated by the quadrature demodulator 63, on the complex plane, thereby to determine the offset components contained in those quadrature-monitored signals i and q; and the feedback control unit 72B determines the different from the attendant offset components thus held, and feeds back the difference to the offset compensator 51.

The difference thus fed back does not contain the clock components transmitted from the inside to the output of the A/D converter 62, but is flexibly reflected by the fluctuation according to the temperature or aging of the offset of the section from the output terminal of the offset compensator 51 through the D/A converter 52 to the input terminal of the quadrature modulator 53.

According to this embodiment, therefore, so long as the aforementioned attendant offset components are deemed to be constant, flexible adaptation is made for the wide change of temperature or other environments and the aging, and the aforementioned offset is kept accurate and stable as in the foregoing thirteenth to sixteenth embodiments.

Here in the aforementioned thirteenth to seventeenth embodiments, the offset components to be fed back to the offset compensator 51 are determined as the DC components indicating the "the degree of imbalance of the section from the output terminal of the offset compensator 51 through the D/A converter 52 to the input terminal of the quadrature modulator 53".

However, the present invention is not limited to such configuration, but its accuracy and responsiveness may also be synergistically enhanced, for example, by applying the aforementioned first to twelfth embodiments together.

The invention is not limited to the above embodiments and various modifications may be made without departing from the spirit and scope of the invention. Any improvement may be made in part or all of the components.

What is claimed is:

1. An offset compensating device comprising:
   a deviation monitor unit which generates a vector signal by A/D-converting a vector sum of results of processings applied to two quadrature AC signals individually in response to an input signal and further quadrature-demodulating a result of the A/D-converting, and which monitors a deviation of DC components superposed on the vector signal; and
   an adaptive control unit which updates a compensation vector determined in advance, on the basis of an adaptive algorithm to minimize an expectation value of a product of an inner product between an increment vector indicating an increment of said deviation with different sample times in chronological order and the compensation vector, and a latest deviation vector indicating the deviation, and which adds the updated compensation vector to an offset vector to be inputted, while being superposed on said input signal, to a circuit to output said vector sum.

2. An offset compensating device according to claim 1, wherein said adaptive control unit determines an inner product of two vectors which make a common angle with respect to all axes of the vector space in a quadrant in a vector space where the two vectors to be determined in their inner product are individually positioned and which have a common absolute value.

3. An offset compensating device according to claim 1, wherein said adaptive control unit sets a step size μ for controlling an updating degree of the compensation vector, in which the larger the deviation, the larger the step size μ is set by the adaptive control unit.

4. An offset compensating device according to claim 1, wherein said adaptive control unit sets a step size μ for controlling an updating degree of the compensation vector, in which the larger an absolute value, the larger the step size $\mu$ is set by the adaptive control unit.

5. An offset compensating device according to claim 1, wherein the larger a deviation determined in advance, the shorter an interval said deviation monitor unit smoothes said DC component.

6. An offset compensating device according to claim 1, wherein the larger an absolute value of said increment vector, the shorter an interval said deviation monitor unit smoothes said DC component.

7. An offset compensating device according to claim 1, wherein said adaptive control unit acts intermittently at a frequency for said compensation vector to be updated.

8. An offset compensating device according to claim 1, wherein said adaptive control unit stops when the deviation becomes lower than a predetermined lower limit.

9. An offset compensating device according to claim 1, wherein said adaptive control unit stops when the absolute value of said increment vector becomes lower than a predetermined lower limit.

10. An offset compensating device according to claim 1, further comprising a dispersion monitor unit which monitors a dispersion of the deviation,
   wherein said adaptive control unit stops when said dispersion becomes lower than a predetermined threshold value.

11. An offset compensating device according to claim 1, further comprising;
   a dispersion monitor unit which monitors a dispersion of the absolute value of said increment vector,
   wherein said adaptive control unit stops when said dispersion becomes lower than a predetermined threshold value.

12. An offset compensating device according to claim 1, wherein said deviation monitor unit monitors the deviation of said DC component with reference to a DC component superposed on said input signal.

13. An offset compensating device according to claim 1, further comprising:
   a quasi-offset monitor unit which detects an instant when an average of a DC component superposed on said input signal becomes "0",
   wherein said deviation monitor unit and said adaptive control unit start every time when said instant is detected by said quasi-offset monitor unit.

14. An offset compensating device according to claim 1, wherein said deviation monitor unit specifies a period for which a level of a component of said vector signal in a low range for an offset caused in said circuit to distribute is lower than a predetermined lower limit, and
   wherein said adaptive control unit stops for the period specified by said deviation monitor unit.

\* \* \* \* \*